United States Patent
Tran et al.

(10) Patent No.: US 9,768,231 B2
(45) Date of Patent: Sep. 19, 2017

(54) HIGH DENSITY MULTI-TIME PROGRAMMABLE RESISTIVE MEMORY DEVICES AND METHOD OF FORMING THEREOF

(71) Applicant: GLOBALFOUNDRIES Singapore Pte. Ltd., Singapore (SG)

(72) Inventors: Xuan Anh Tran, Singapore (SG); Eng Huat Toh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/042,157

(22) Filed: Feb. 12, 2016

(65) Prior Publication Data

US 2017/0236869 A1 Aug. 17, 2017

(51) Int. Cl.
- *H01L 21/8222* (2006.01)
- *H01L 27/24* (2006.01)
- *H01L 45/00* (2006.01)

(52) U.S. Cl.
CPC ...... *H01L 27/2436* (2013.01); *H01L 45/1253* (2013.01); *H01L 45/1608* (2013.01)

(58) Field of Classification Search
CPC ............... H01L 27/10852; H01L 27/11; H01L 27/2463
USPC ........ 257/296; 438/238, 170, 189, 309, 329; 365/49.13
See application file for complete search history.

(56) References Cited

U.S. PATENT DOCUMENTS

| | | | | |
|---|---|---|---|---|
| 5,973,356 A * | 10/1999 | Noble | ............... | H01L 21/28273 257/314 |
| 7,824,954 B2 * | 11/2010 | An | ....................... | H01L 27/2409 257/4 |
| 8,021,966 B2 * | 9/2011 | Jeong | .................. | H01L 45/1273 257/314 |
| 8,198,620 B2 * | 6/2012 | Chen | ..................... | H01L 45/124 257/13 |
| 8,237,457 B2 * | 8/2012 | Chakravarti | ........ | H01L 23/5252 257/50 |
| 8,501,574 B2 * | 8/2013 | Chang | ................ | G11C 13/0009 257/E21.004 |
| 8,575,584 B2 * | 11/2013 | Satoh | .................... | H01L 27/101 257/2 |
| 8,664,634 B2 * | 3/2014 | Lee | ..................... | H01L 27/2463 257/5 |

(Continued)

OTHER PUBLICATIONS

Chin Yu Mei et al., 28nm High-K Metal Gate RRAM with Fully Compatible CMOS Logic Processes, 2013 International Symposium on VLSI Technology, Systems, and Applications (VLSI-TSA), IEEE.

(Continued)

*Primary Examiner* — Jay C Kim
(74) *Attorney, Agent, or Firm* — Horizon IP Pte. Ltd.

(57) ABSTRACT

Multi-time programmable (MTP) random access memory (RRAM) devices and methods for forming a MTP RRAM device are disclosed. The method includes providing a substrate. The substrate is prepared with at least a first region for accommodating one or more multi-programmable based resistive random access memory (RRAM) cell. A fin-type based selector is provided over the substrate in the first region. A storage element of the RRAM cell is formed over the fin-type based selector. The fin-type based selector is coupled in series with the storage element of the RRAM cell.

19 Claims, 22 Drawing Sheets

(56) References Cited

U.S. PATENT DOCUMENTS

| | | | | |
|---|---|---|---|---|
| 8,822,969 | B2* | 9/2014 | Hwang | H01L 45/126 257/4 |
| 8,848,423 | B2* | 9/2014 | Chung | H01L 27/1211 365/148 |
| 8,884,263 | B2* | 11/2014 | Oh | H01L 27/2409 257/4 |
| 8,895,402 | B2* | 11/2014 | Toh | H01L 45/141 257/5 |
| 8,927,328 | B2* | 1/2015 | Kim | H01L 29/66666 257/2 |
| 8,958,234 | B2* | 2/2015 | Nodin | G11C 13/0007 365/148 |
| 9,054,296 | B2* | 6/2015 | Kim | H01L 45/06 |
| 9,236,567 | B2* | 1/2016 | Lee | H01L 45/1253 |
| 9,640,586 | B2* | 5/2017 | Seong | H01L 27/2409 |
| 2009/0008623 | A1* | 1/2009 | Lim | H01L 21/28518 257/4 |
| 2014/0264228 | A1* | 9/2014 | Toh | H01L 45/1233 257/4 |

OTHER PUBLICATIONS

Chin Yu Mei et al., 28-nm 2T High-K Metal Gate Embedded RRAM With Fully Compatible CMOS Logic Processes, IEEE Electron Device Letters, Oct. 2013, pp. 1253-1255, 34-10, IEEE.

X. A. Tran et al., High Performance Unipolar AlOy/HfOx/Ni based RRAM Compatible with Si Diodes for 3D Application, 2011 Symposium on VLSI Technology Digest of Technical Papers, IEEE.

X. A. Tran et al., Self-Rectifying and Forming-Free Unipolar HfOx based-High Performance RRAM Built by Fab-Avaialbe Materials, 2011 IEEE International Electron Devices Meeting (IEDM), IEEE.

V. S. S. Srinivasan et al., Punchthrough-Diode-Based Bipolar RRAM Selector by Si Epitaxy, IEEE Electron Device Letters, Oct. 2012, pp. 1396-1398, 33-10, IEEE.

X. P. Wang et al., Highly Compact 1T-1R Architecture (4F2 Footprint) Involving Fully CMOS Compatible Vertical GAA Nano-Pillar Transistors and Oxide-Based RRAM Cells Exhibiting Excellent NVM Properties and Ultra-Low Power Operation, 2012 IEEE International Electron Devices Meeting (IEDM), IEEE.

Cong Xu et al., Overcoming the Challenges of Crossbar Resistive Memory Architectures, 2015 IEEE 21st International Symposium on High Performance Computer Architecture (HPCA), Feb. 7-11, 2015, IEEE.

Cong Xu et al., Design Implications of Memristor-Based RRAM Cross-Point Structures, 2011 Design, Automation & Test in Europe Conference & Exhibition (Date), Mar. 14-18, 2011, IEEE.

\* cited by examiner

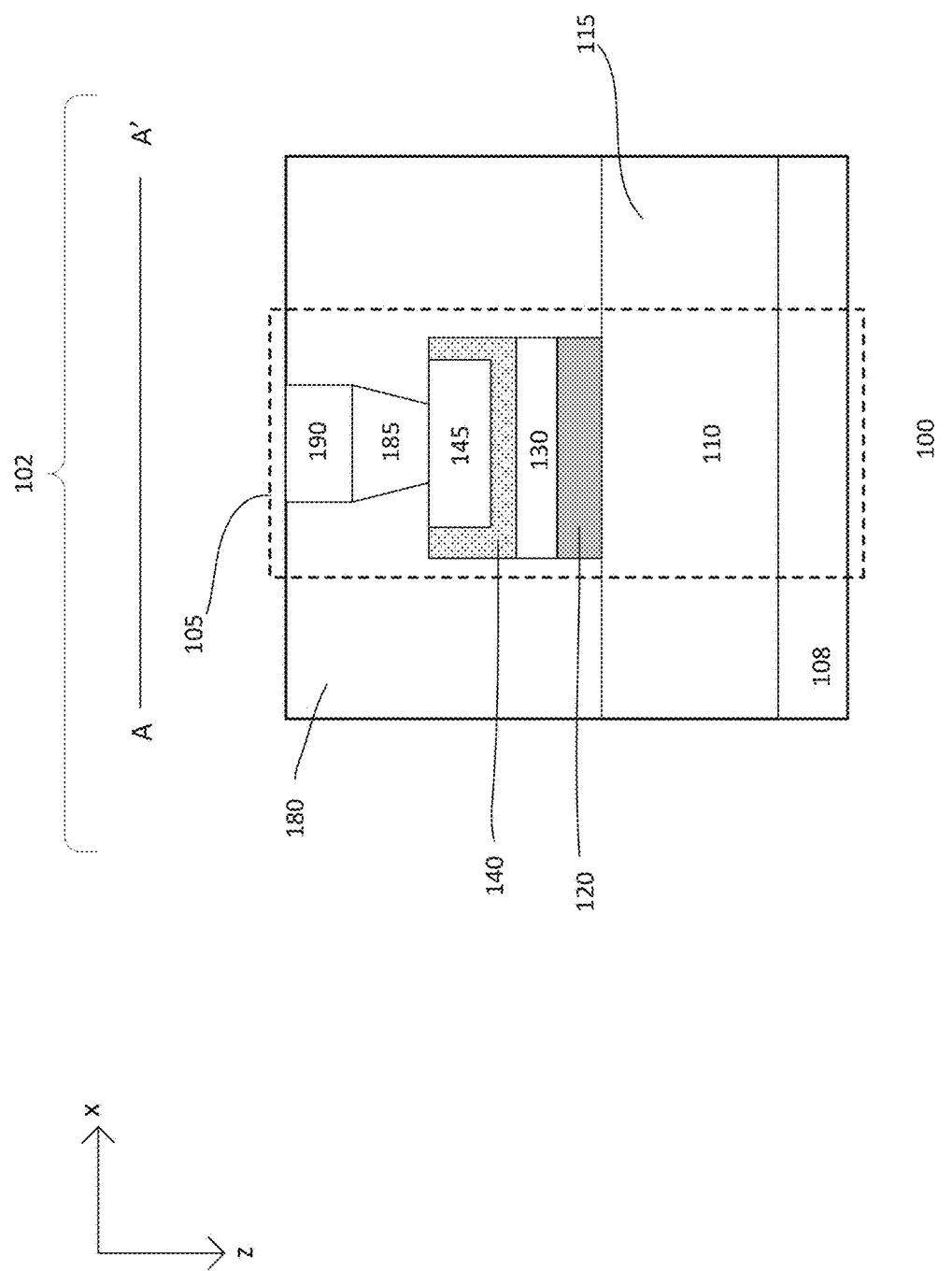

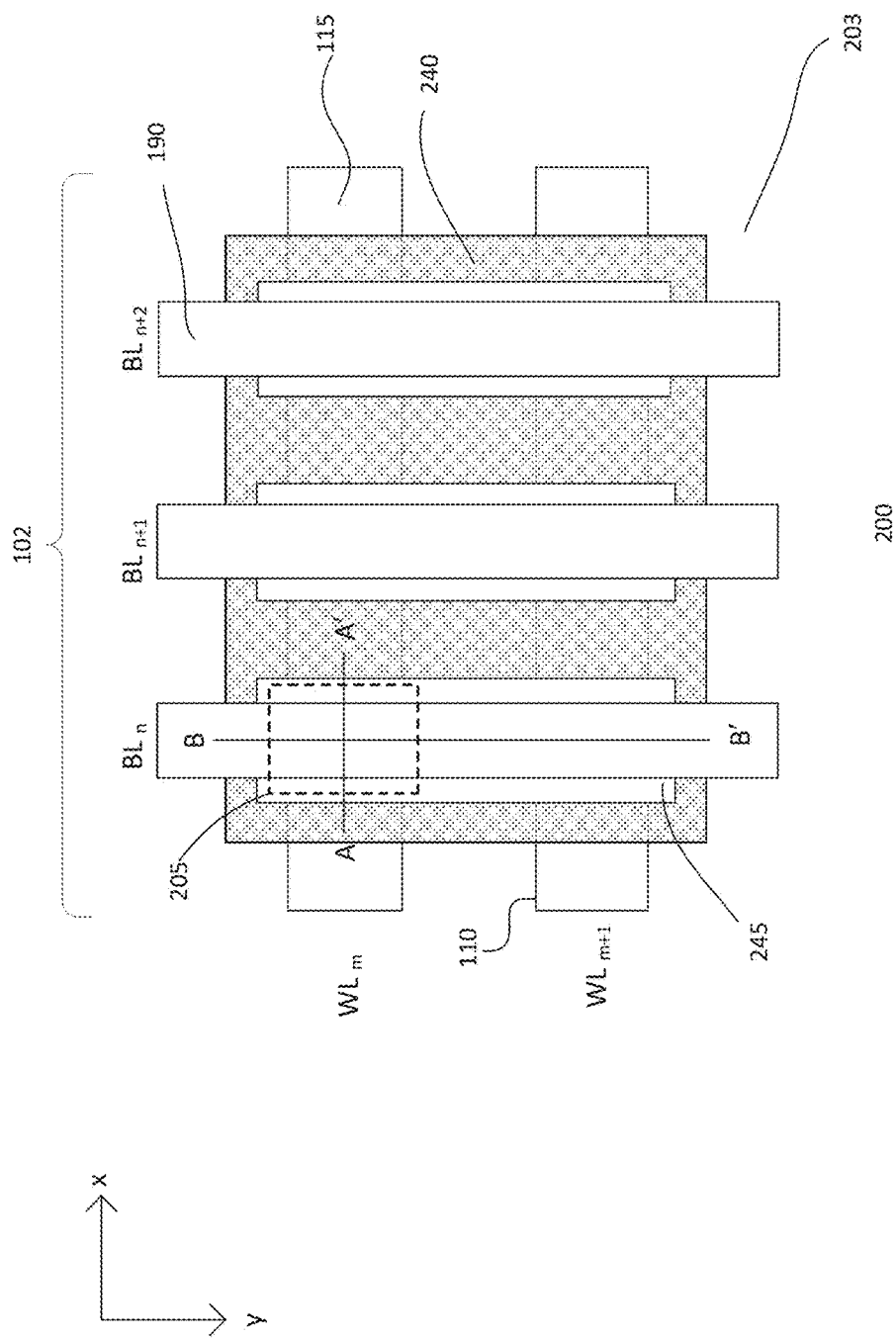

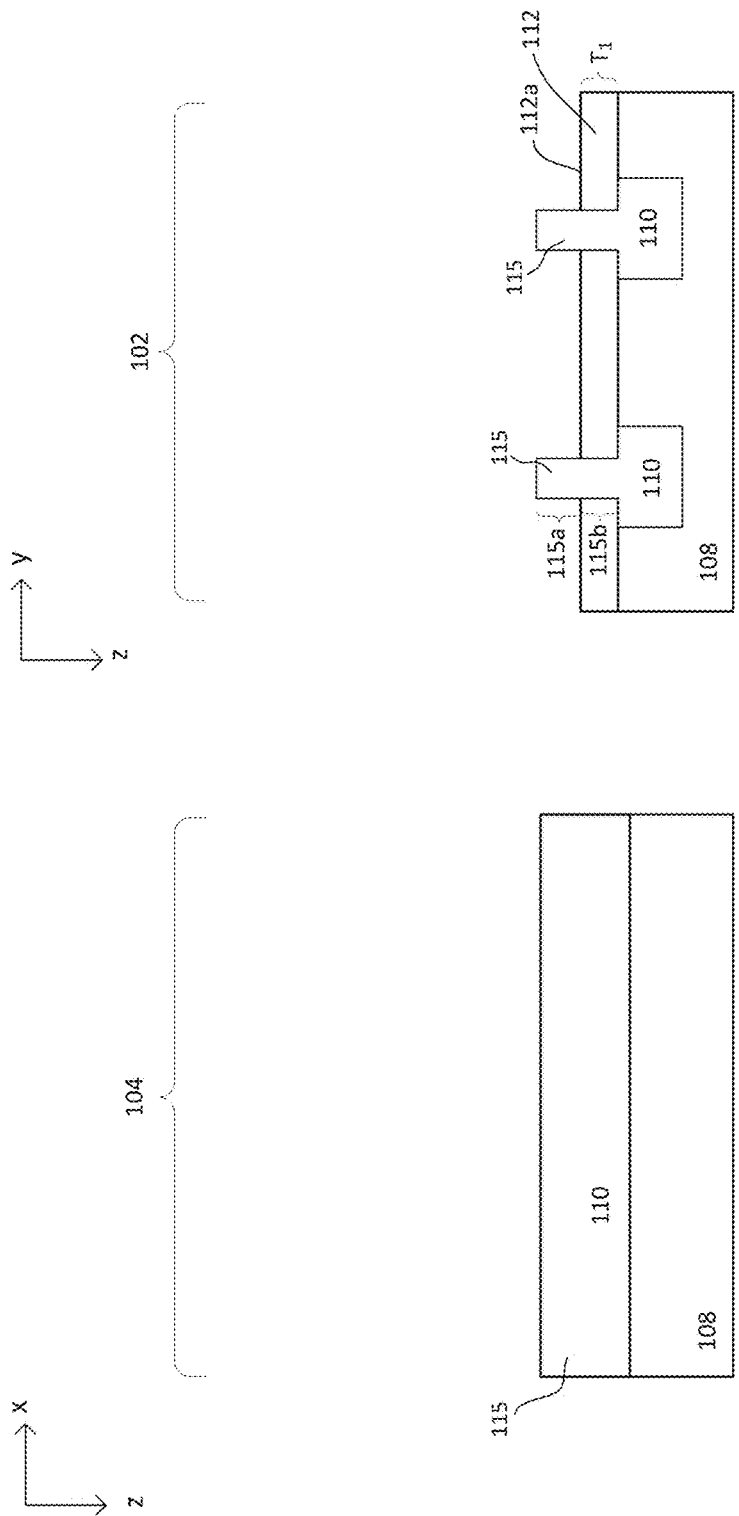

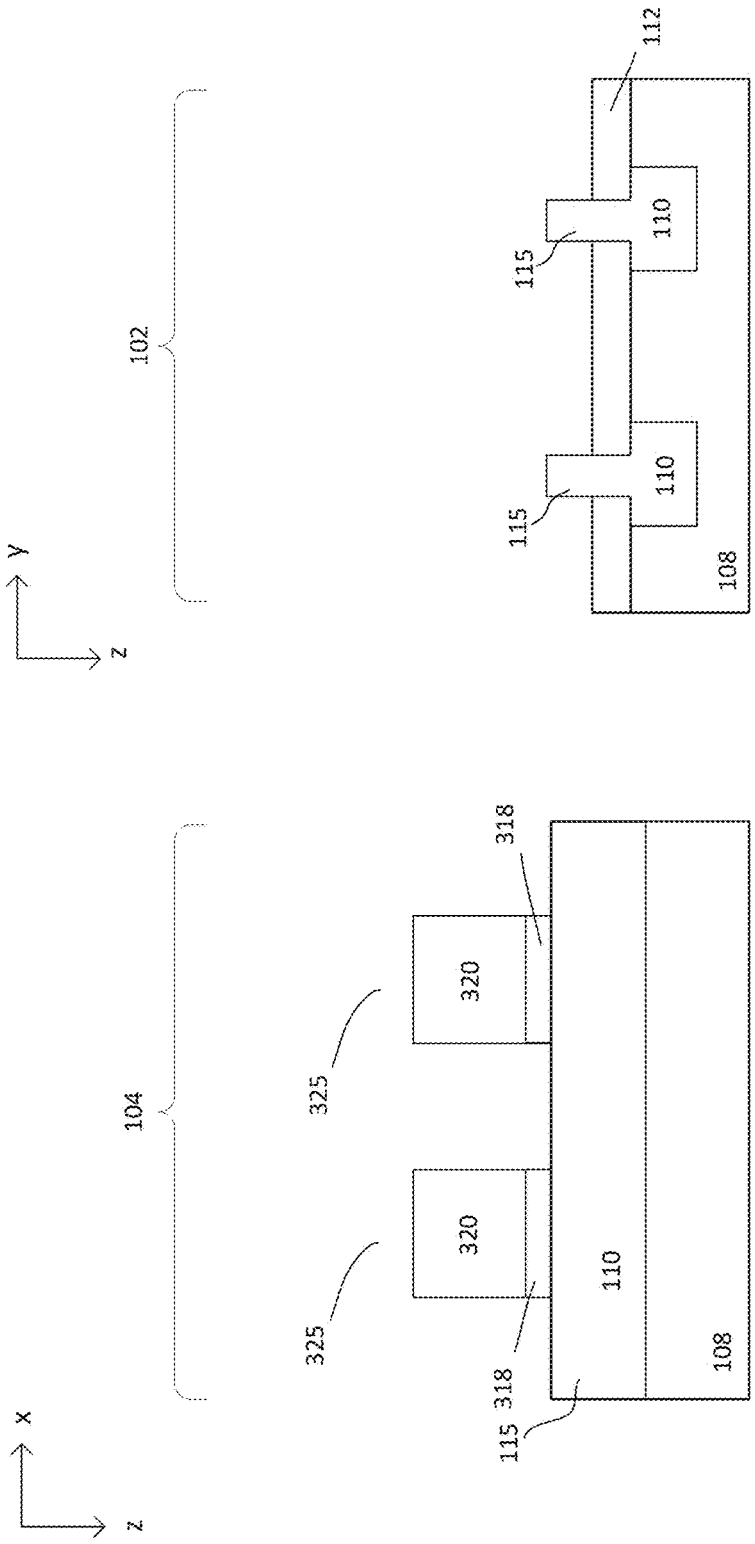

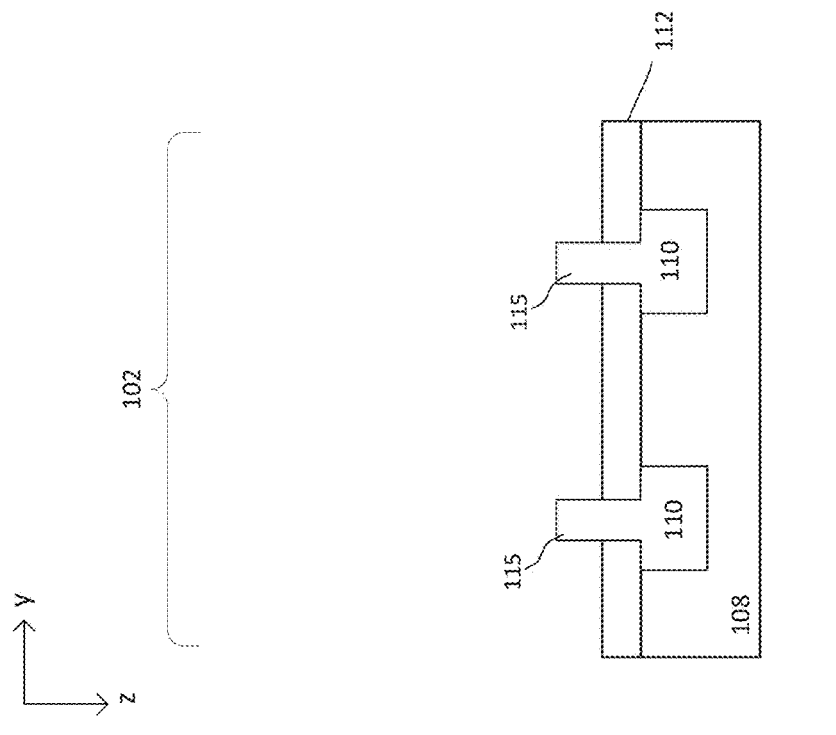
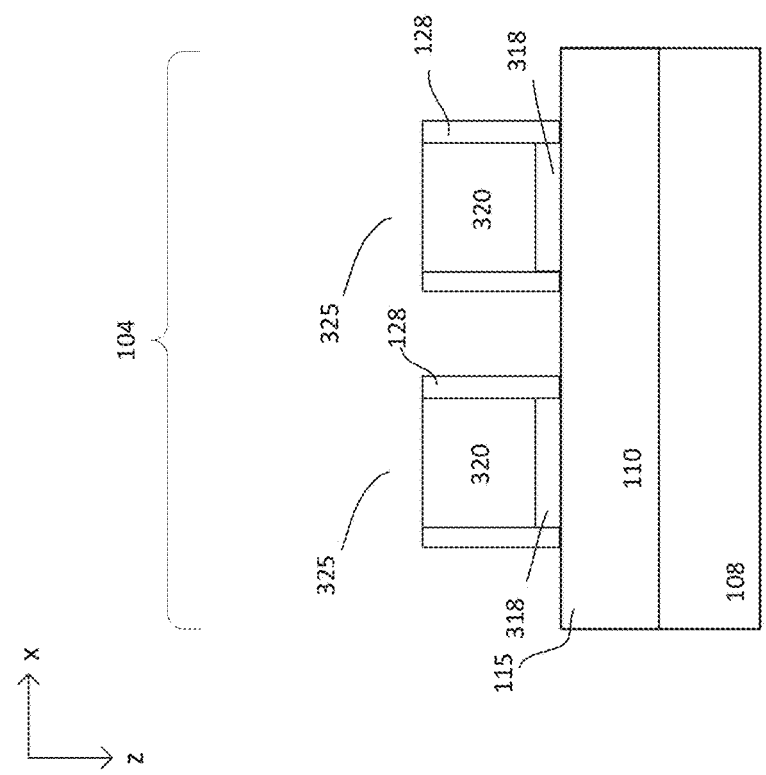
Fig. 3c₁
Fig. 3c₂

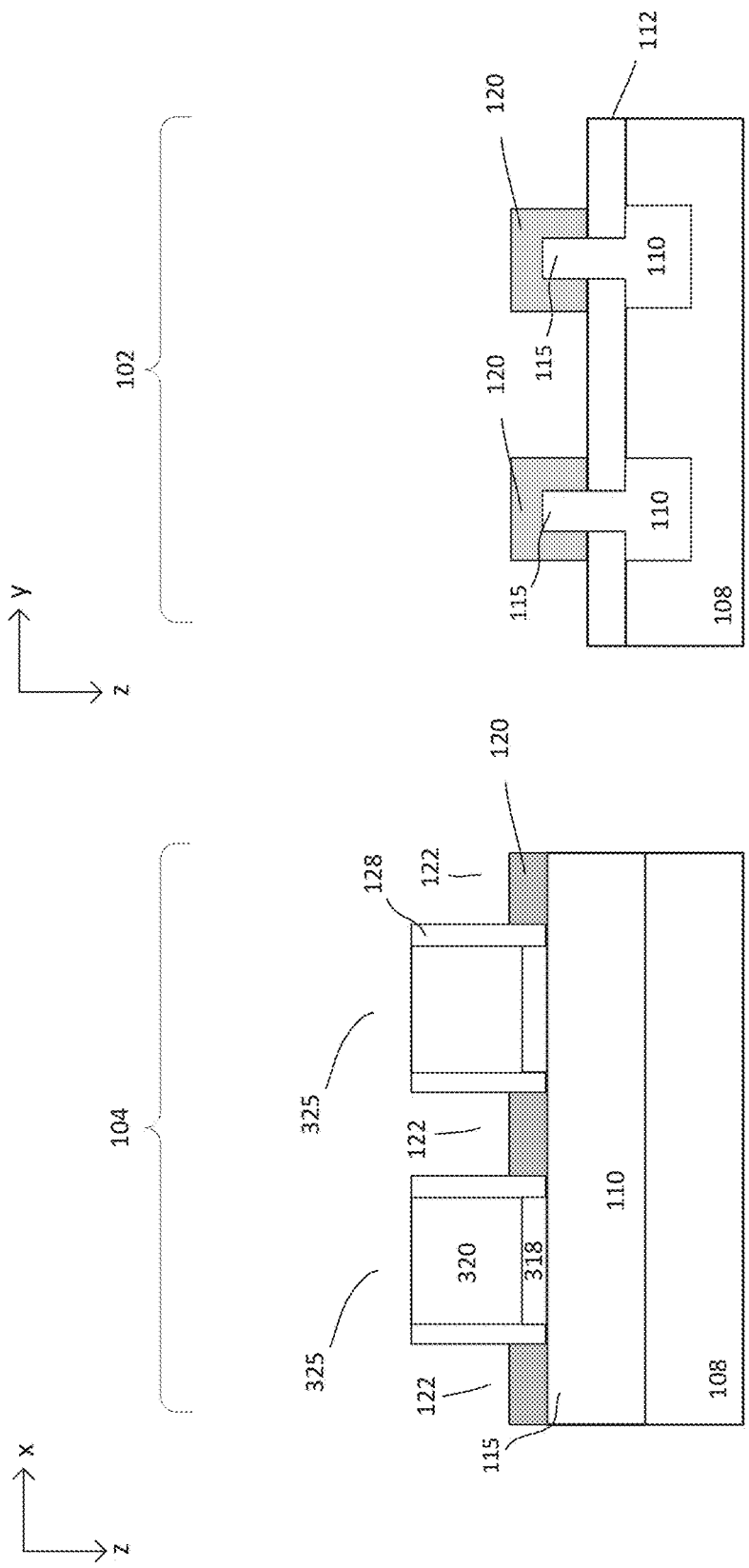

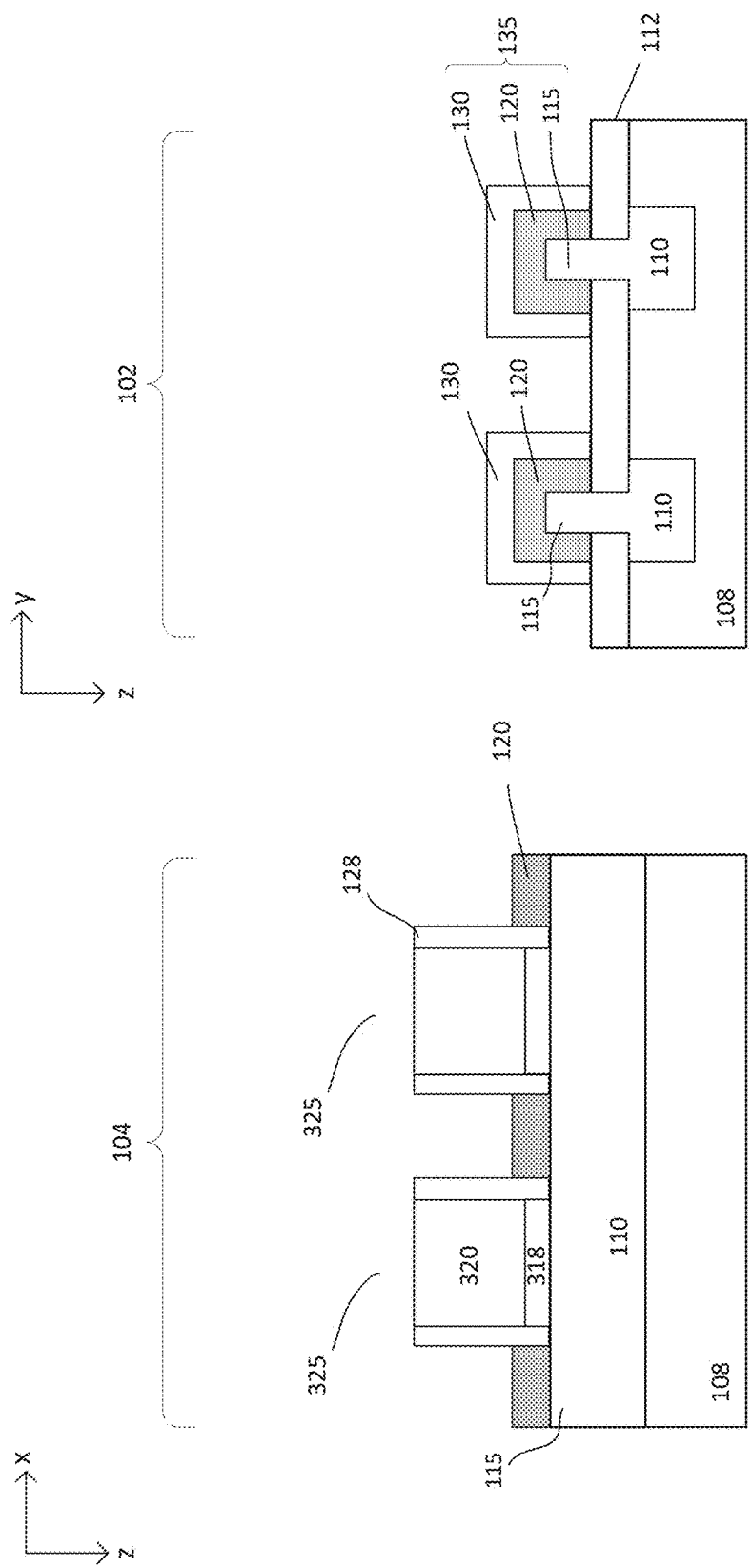

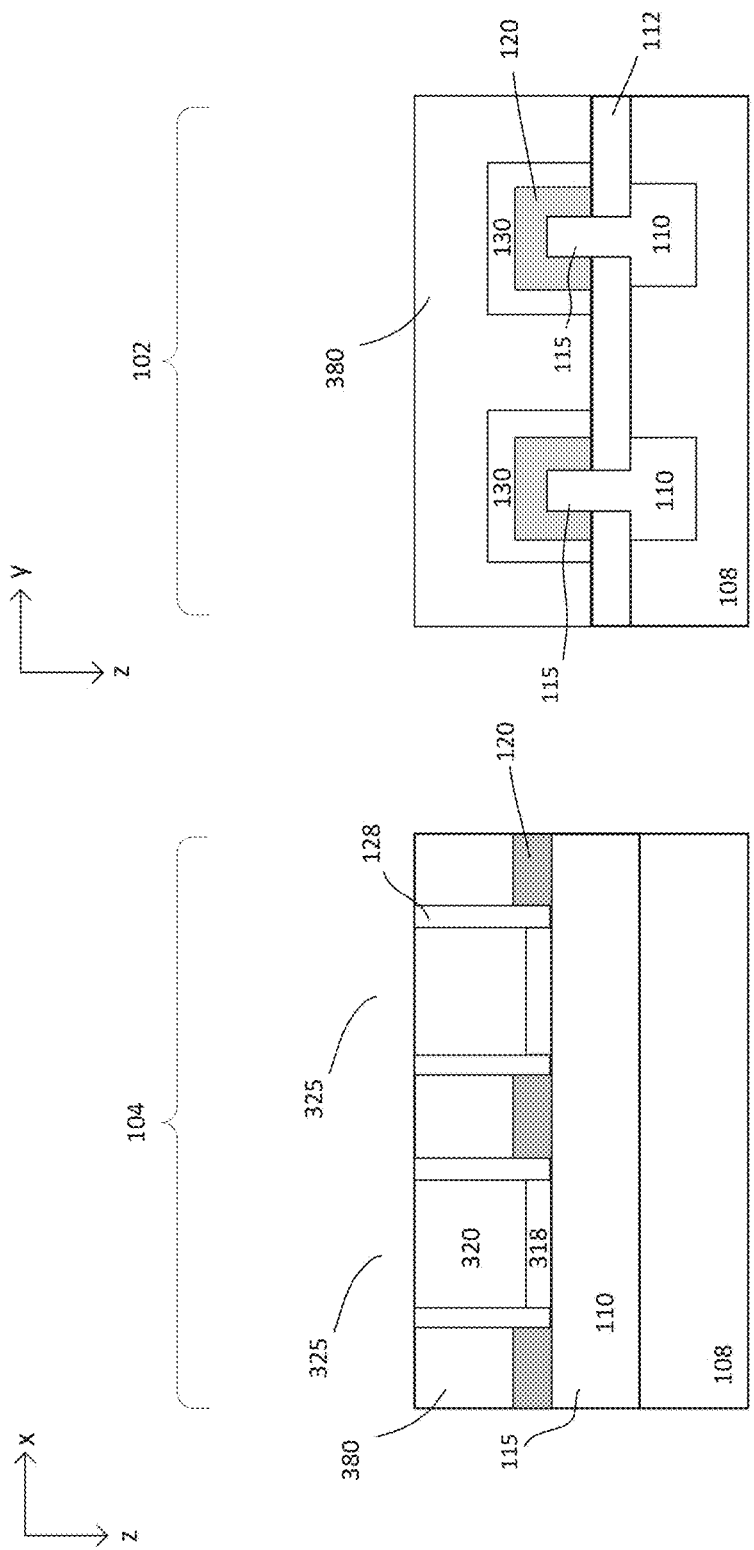

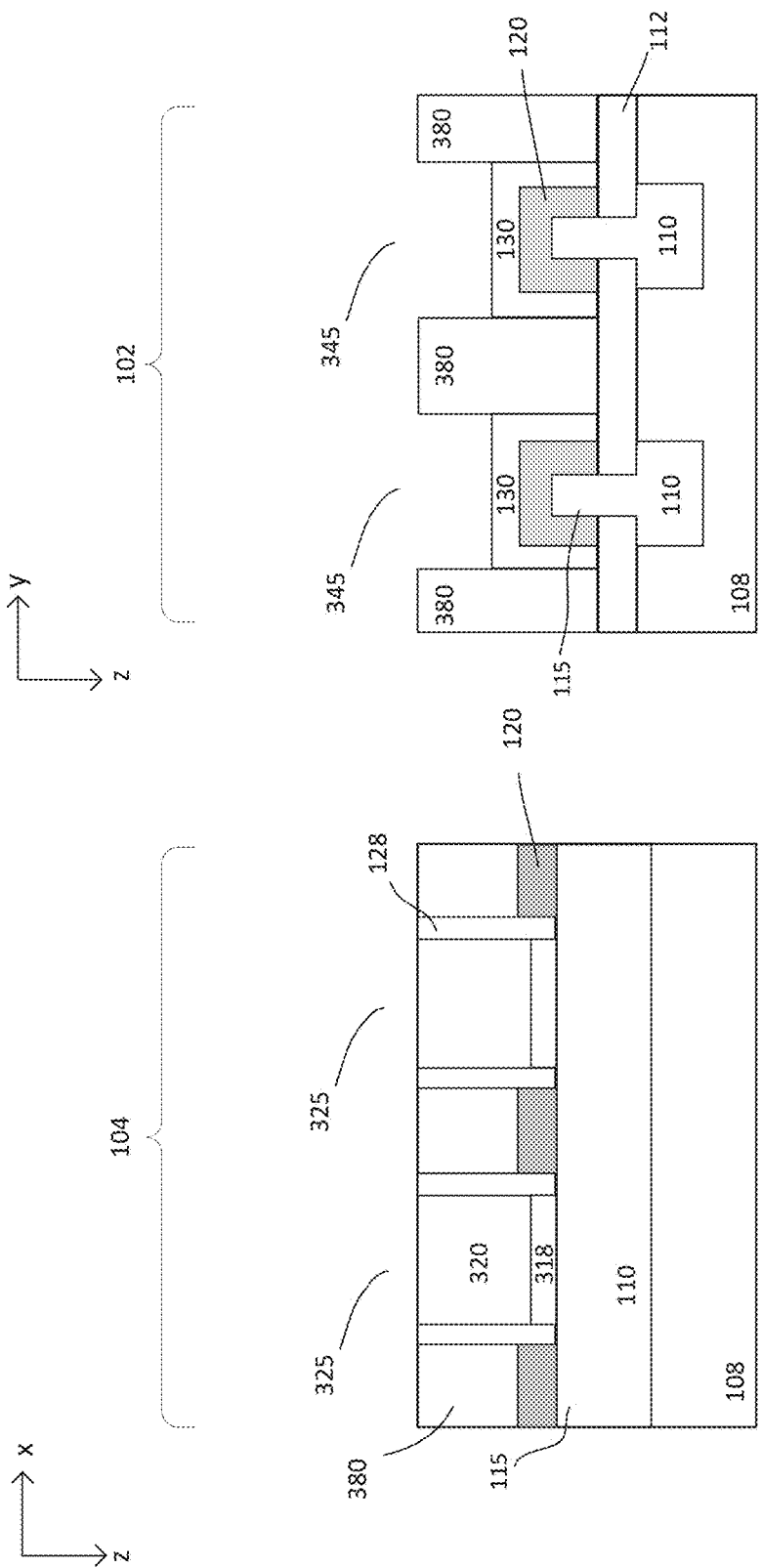

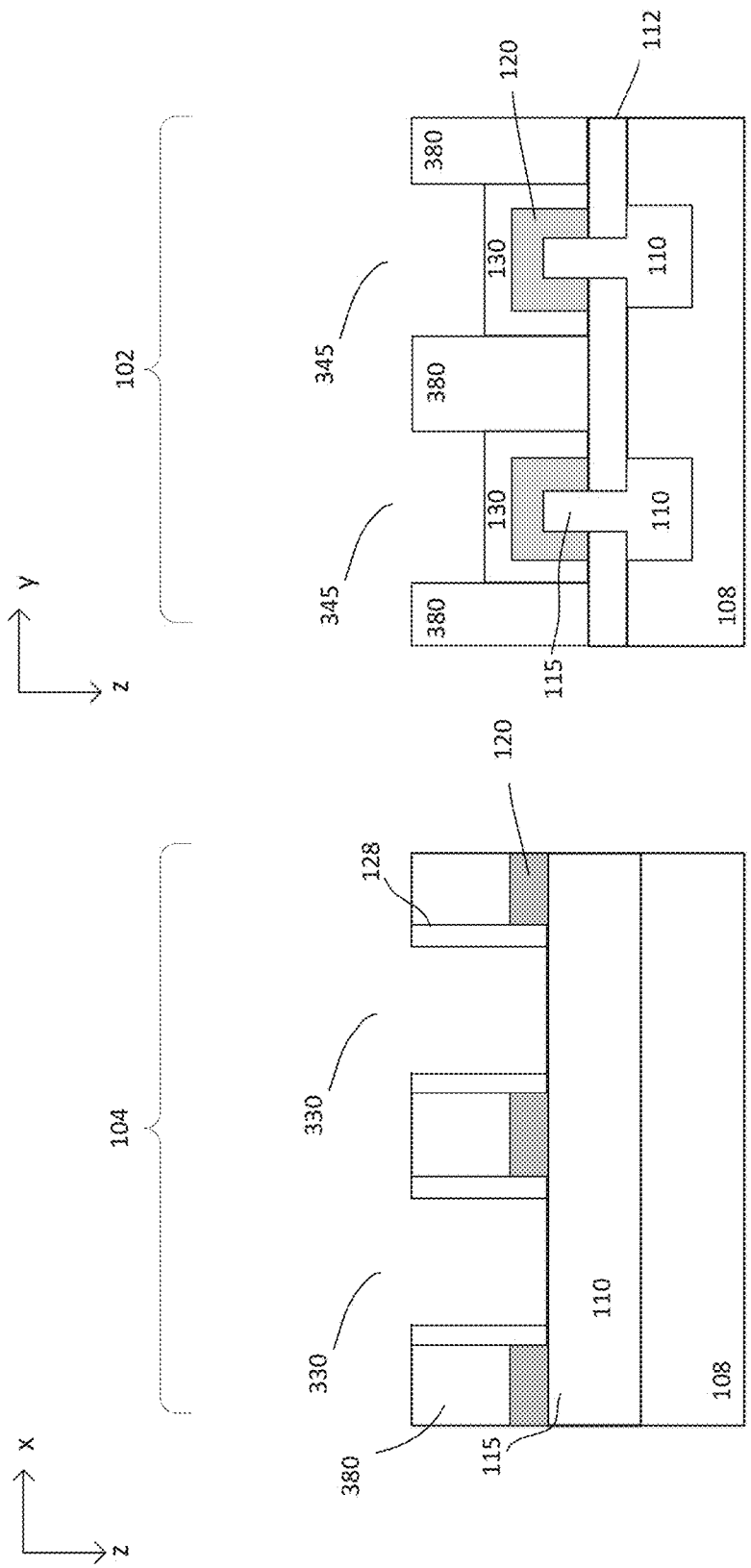

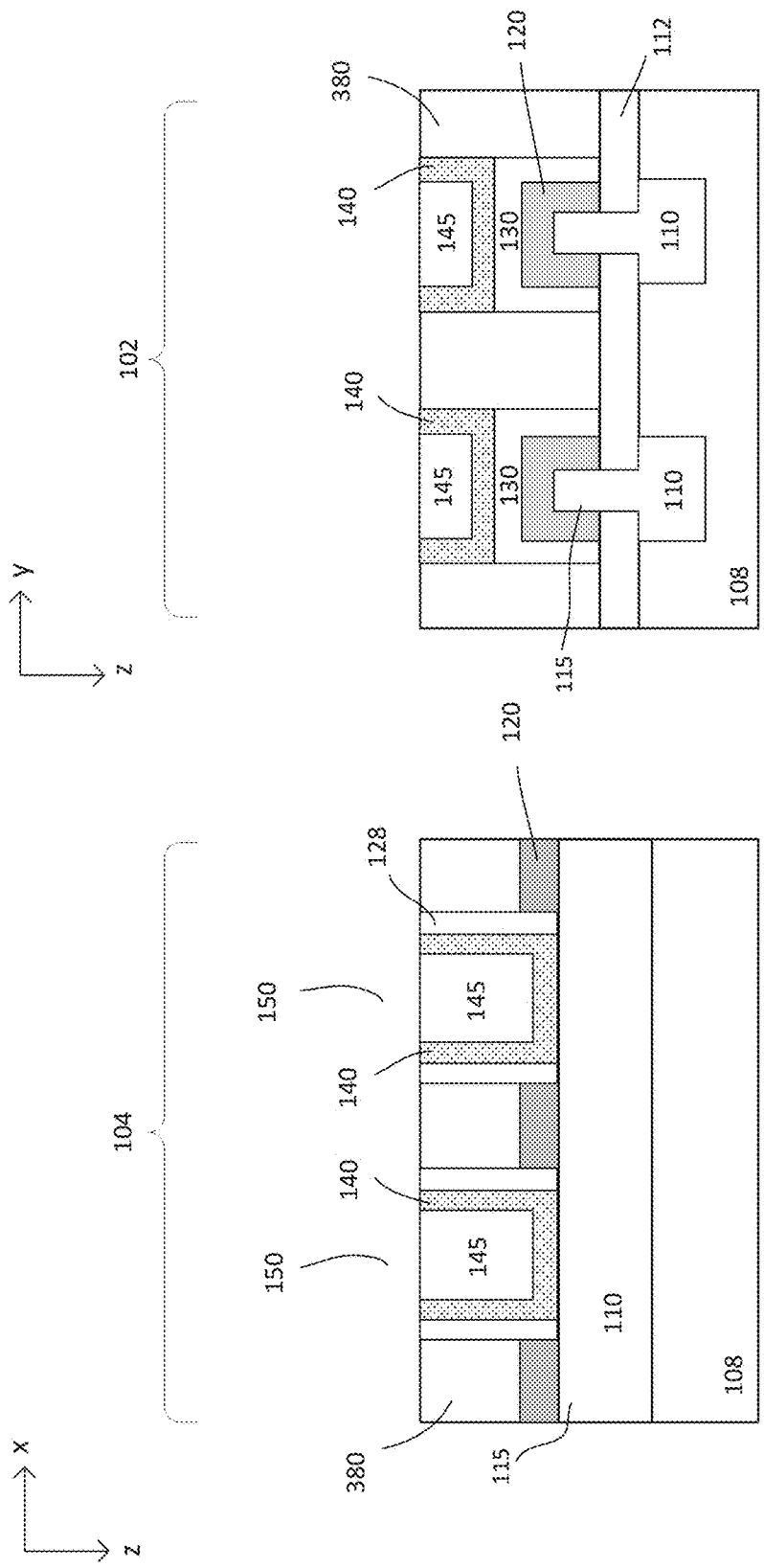

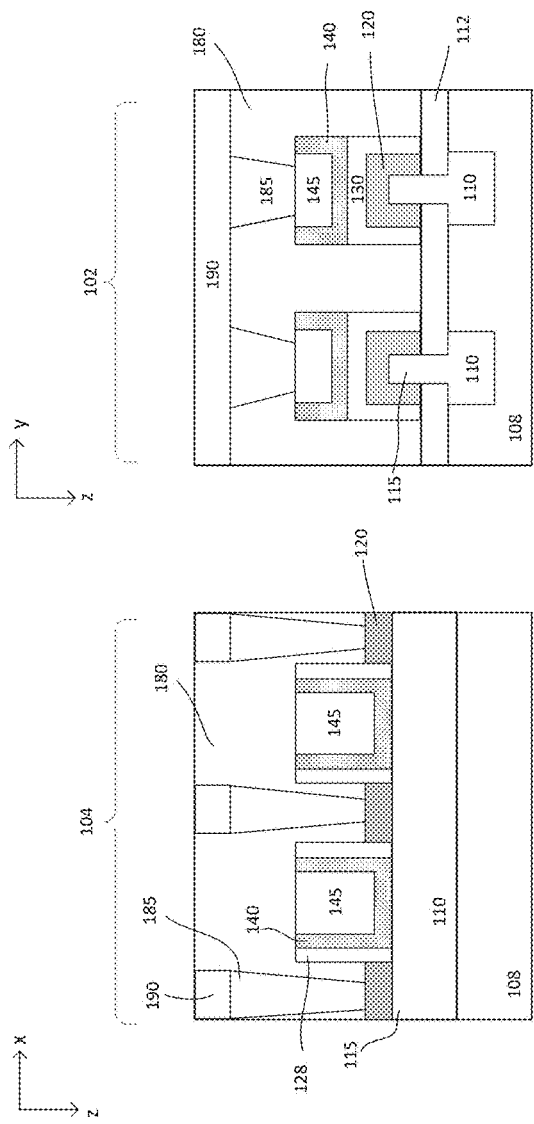

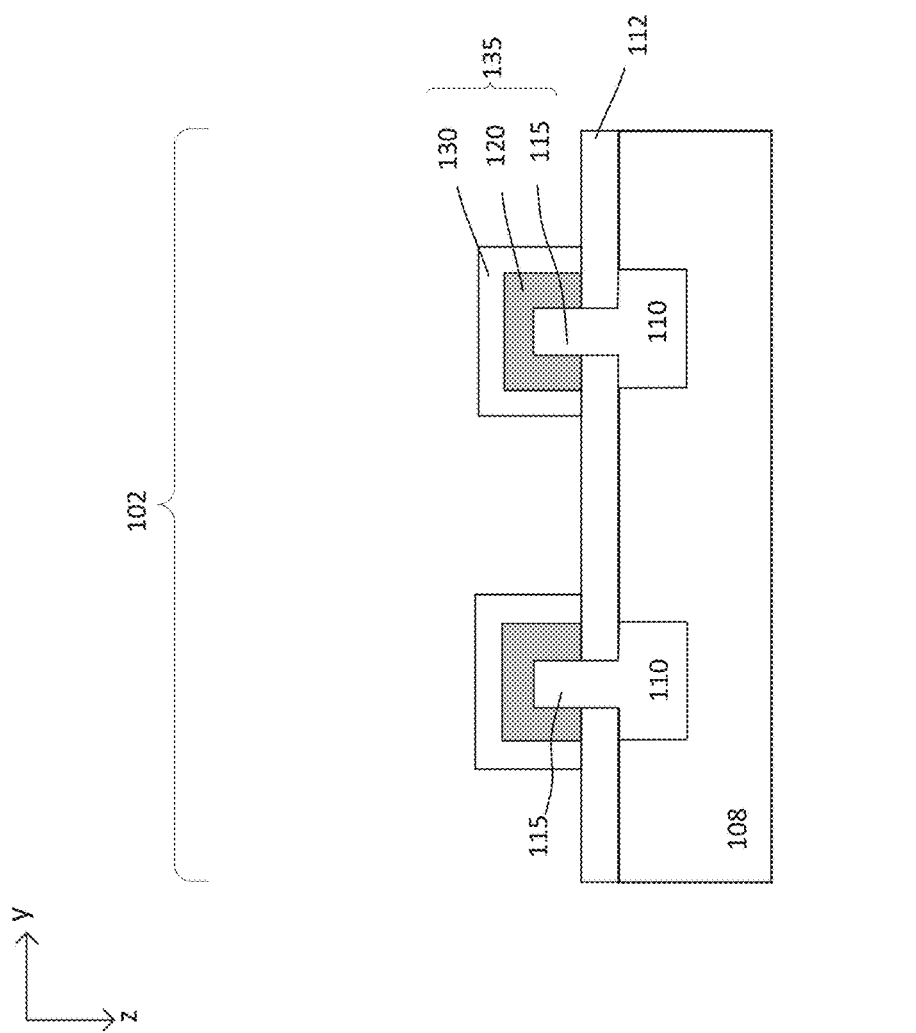

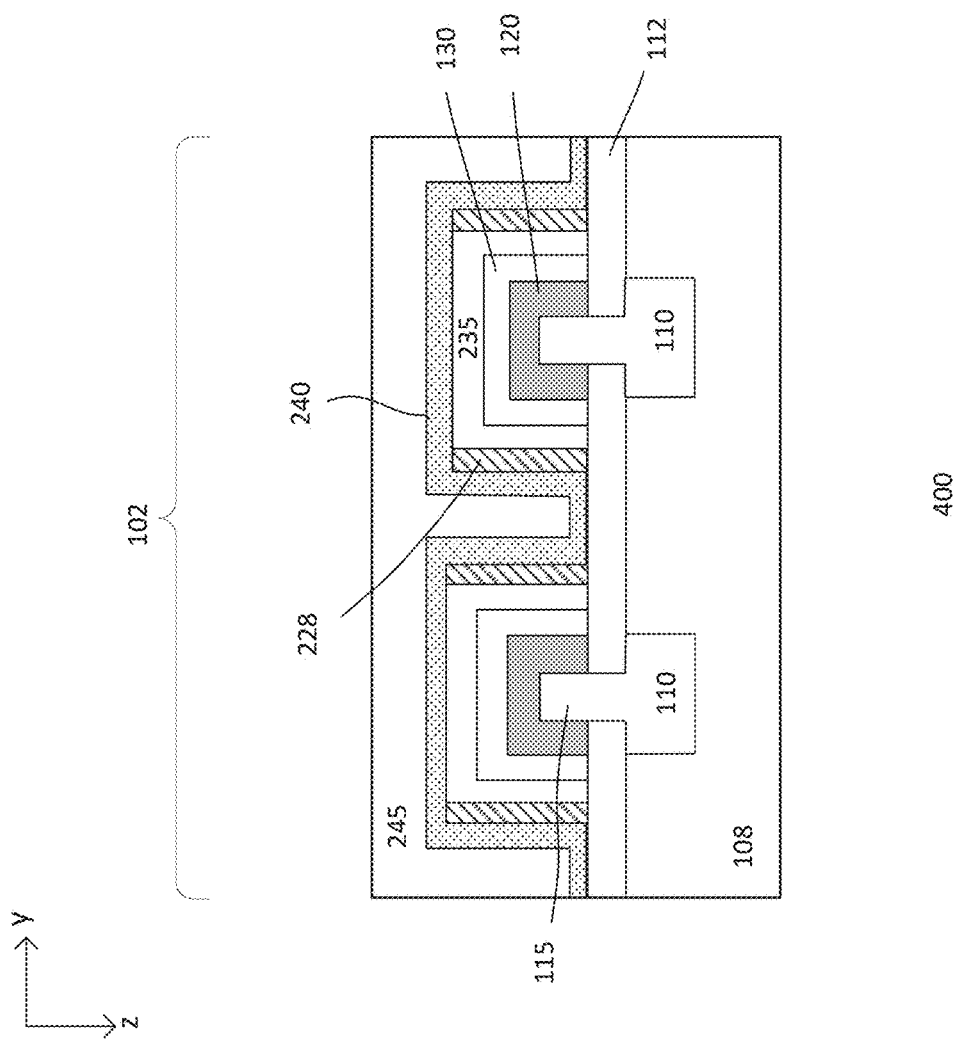

US 9,768,231 B2

1

HIGH DENSITY MULTI-TIME PROGRAMMABLE RESISTIVE MEMORY DEVICES AND METHOD OF FORMING THEREOF

BACKGROUND

Non-volatile memory (NVM) has achieved widespread adoptions for code and data storage applications. Recently, NVM has been employed as embedded memory units in system on chips (SoC) designs. A typical SoC may include embedded flash memory in its selection of NVM units. However, the process to form a flash memory may be complicated, resulting in extra cost and yield issue. A Multi-time programmable (MTP) NVM technology is increasingly recognized as a viable alternative to flash memory technology. However, there is still a need to provide simplified design and process of forming MTP NVM devices with better performance and lower cost of fabrication.

The present disclosure is directed to CMOS logic compatible high-density MTP NVM devices and methods of forming thereof.

SUMMARY

Embodiments generally relate to MTP RRAM devices and methods for forming a MTP RRAM device. In one embodiment, a method for forming a device is disclosed. The method includes providing a substrate. The substrate is prepared with at least a first region for accommodating one or more multi-time programmable based resistive random access memory (RRAM) cell. A fin-type based selector is provided over the substrate in the first region. A storage element of the RRAM cell is formed over the fin-type based selector. The fin-type based selector is coupled in series with the storage element of the RRAM cell.

In another embodiment, a method for forming a device is disclosed. The method includes providing a substrate. The substrate is prepared with at least a first region for accommodating one or more multi-time programmable based resistive random access memory (RRAM) cell and a second region for accommodating one or more logic transistors. A fin-type based selector is provided over the substrate in the first region. A fin-type based logic transistor is provided in the second region. A storage element of the RRAM cell is formed over the fin-type based selector in the first region. The fin-type based selector is coupled in series with the storage element of the RRAM cell.

In yet another embodiment, a device is disclosed. The device includes a substrate having at least a first region for accommodating one or more multi-time programmable based resistive random access memory (RRAM) cell. A fin-type based selector is disposed over the substrate in the first region. A storage element of the RRAM cell is disposed over the fin-type based selector. The fin-type based selector is coupled in series with the storage element of the RRAM cell.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 1a-1d show various views of an embodiment of a device;

FIGS. 2a-2c show various views of another embodiment of a device;

FIGS. 3a-3j show cross-sectional views of an embodiment of a process for forming a device where figures with a subscript 1 relate to cross-sectional views of a logic region along the x-z direction while figures with a subscript 2 relate to cross-sectional views of a memory region taken along the y-z direction; and FIGS. 4a-4e show cross-sectional views of another embodiment of a process for forming a device.

DETAILED DESCRIPTION

Embodiments generally relate to semiconductor devices or integrated circuits (ICs). Some embodiments relate to memory devices, such as non-volatile memory (NVM) devices. More particularly, some embodiments relate to multi-time programmable (MTP) resistive random-access memory (RRAM) devices using fin-type based bipolar selector. Such memory devices, for example, can be incorporated into standalone memory devices, such as USB or other types of portable storage units, or ICs, such as microcontrollers or system on chips (SoC). The devices or ICs can be incorporated into or used with, for example, consumer electronic products, or relate to other types of devices.

Figure 1A:
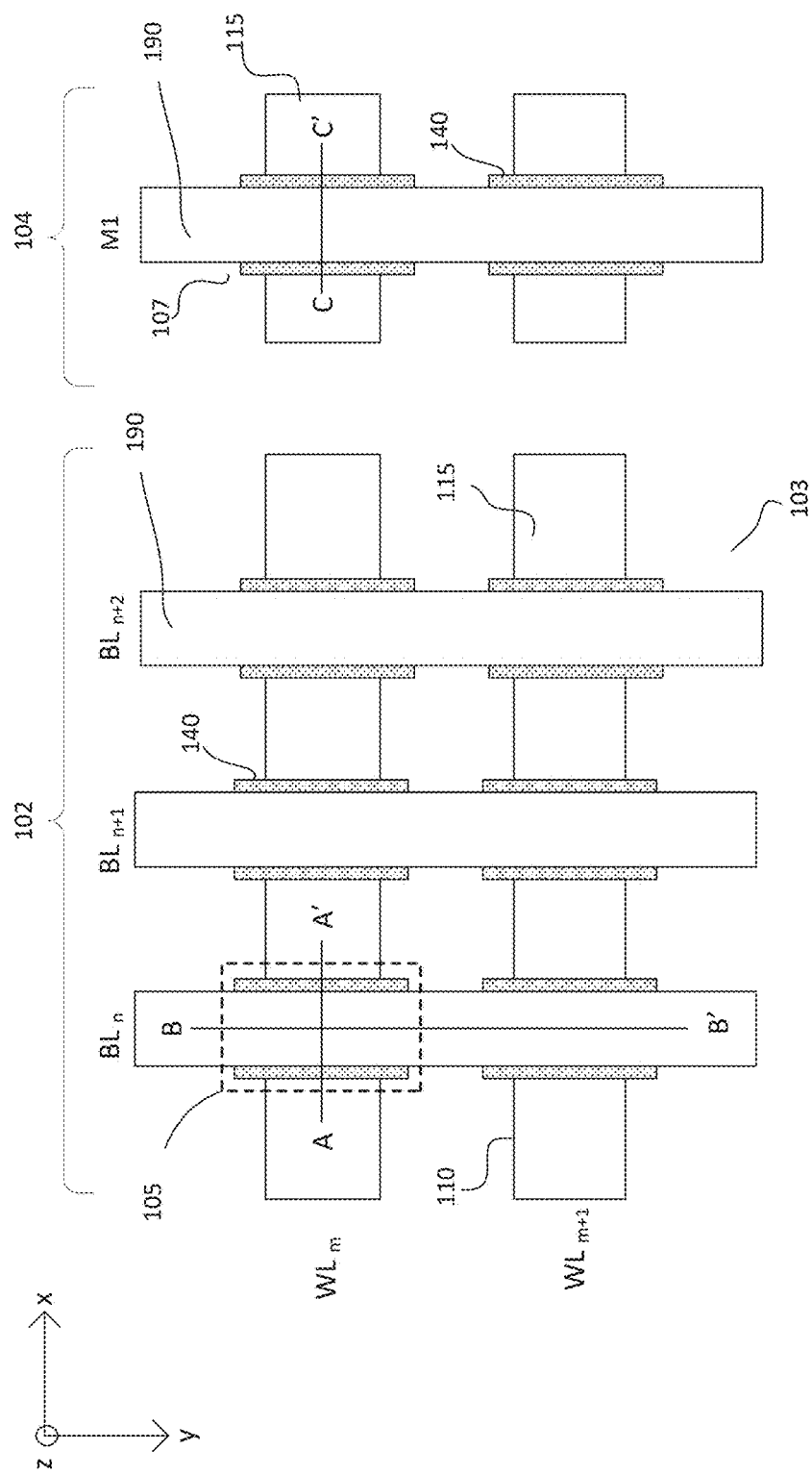
Figure 1B:
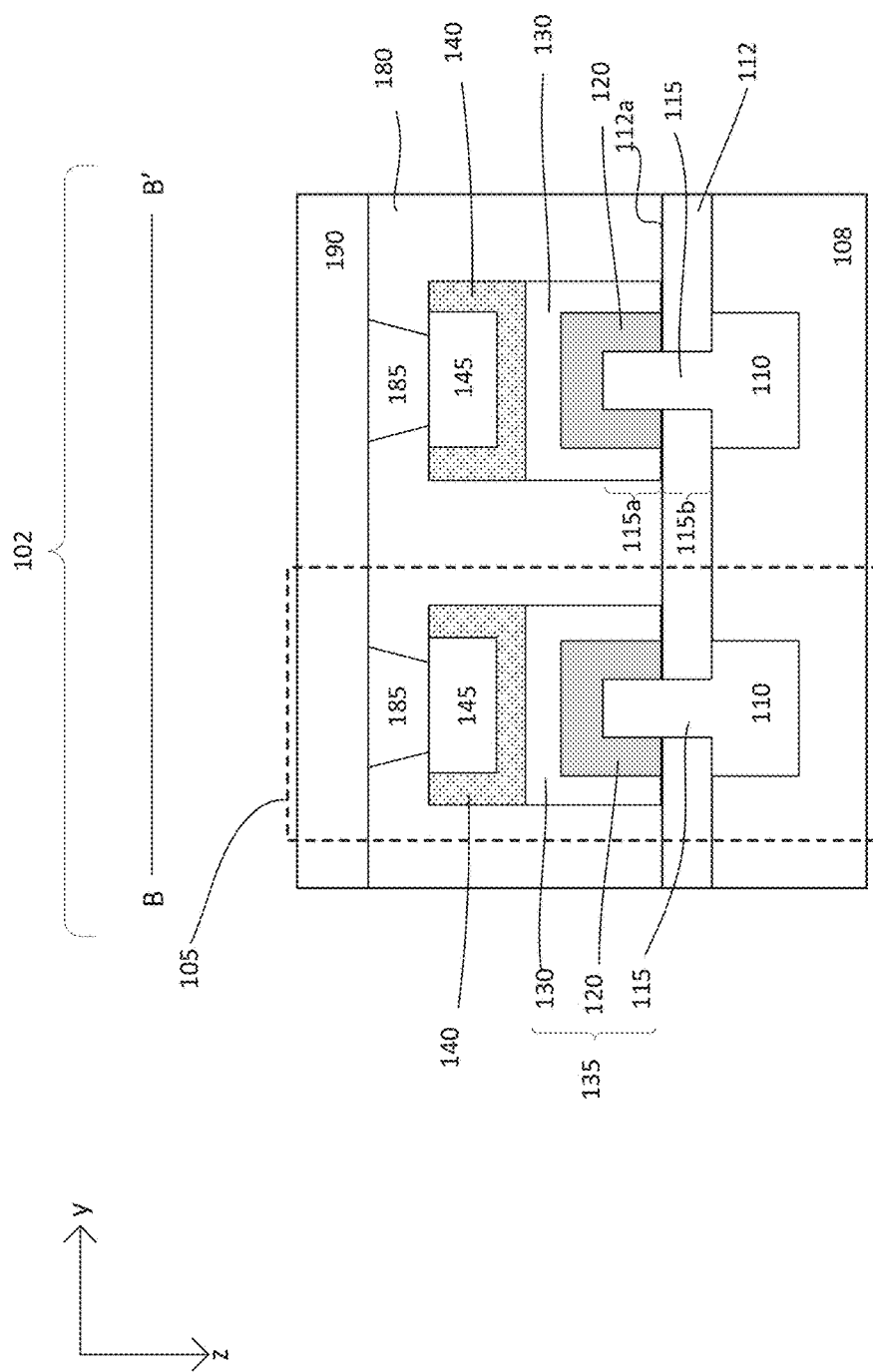
Figure 1D:
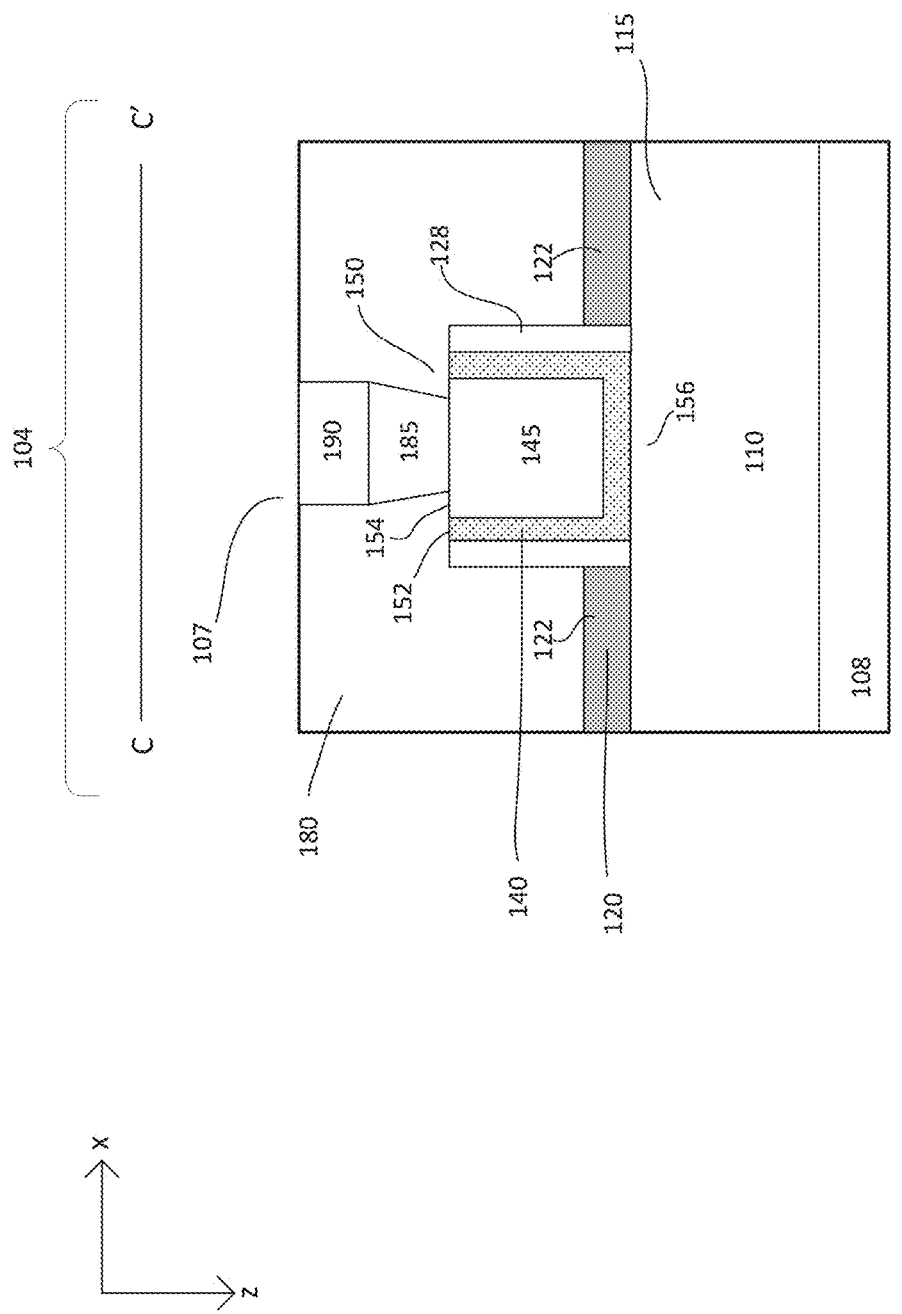

FIGS. 1a-1d show various views of an embodiment of a device 100. FIG. 1a shows a simplified top view of a cross-bar memory array in a first region 102 and top view of logic components in a second region 104 while FIGS. 1b-1d show corresponding cross-sectional views. FIG. 1b shows a cross-sectional view of the first region of the device taken along B-B' and FIG. 1c shows a cross-sectional view of the first region of the device taken along A-A'. As for FIG. 1d, it shows a cross-sectional view of the second region of the device taken along C-C'. The first region 102 is a memory or array region for accommodating a plurality of memory cells 105. In one embodiment, the memory cells are MTP based RRAM cells. As for the second region 104, it is a logic region for accommodating one or more logic transistors which serve as peripheral circuits for the cross-bar RRAM array. The peripheral circuit, for example, may include row decoder, column decoder, multiplexor, sense amplifier or other digital circuit. Although two regions are shown, it is understood that other suitable number and types of device regions (not shown) may be included in the device.

As shown in FIG. 1a, a plurality of memory cells 105 in the first region are interconnected by conductive lines to form an array 103. For example, first conductive lines 110 are disposed along a first direction (or x direction) of the array and second conductive lines 190 are disposed along a second direction (or y direction) of the array. The conductive lines include, for example, wordlines and bitlines. For example, the array includes wordlines $WL_m$ and $WL_{m+1}$ disposed along the first direction and bitlines $BL_n$, $BL_{n+1}$, $BL_{n+2}$ disposed along the second direction. Wordlines interconnect memory cells in the first direction while bitlines interconnect memory cells in the second direction. For example, the first direction may be the row or wordline (WL) direction and the second direction may be the column or bitline (BL) direction. The first and second directions are, for example, orthogonal to each other. Other configurations of WLs and BLs may also be useful. For example, the WLs and BLs may be interchangeable.

In one embodiment, the first and second conductive lines are coupled to contact regions of the memory cells 105. The first and second conductive lines may be disposed in different device levels of the array. For example, the first conductive line may correspond to a doped region positioned in the substrate below a memory cell while the second conductive line may correspond to a metal line positioned in a dielectric layer over the substrate and above the memory cell as will be described in detail later. In one embodiment, the first conductive line may serve as a common WL along a row of memory cells and the second conductive line may serve as a common BL along a column of memory cells. The BLs, in one embodiment, may be positioned over the WLs. In other embodiments, WLs may be disposed over the BLs. The memory cells of the array may be disposed at the row-column intersections to form a cross-point or cross-bar memory array 103. Other configurations and arrangement of the first and second conductive lines may also be useful.

Each memory cell 105 includes a selector element coupled in series to a memory element. For example, the selector element serves as a cell selector and the memory element serves as a storage element of the memory cell. In one embodiment, the memory element is a resistive memory element, forming a resistive RAM (RRAM) cell. In one embodiment, the selector element includes a bipolar selector. The bipolar selector, in one embodiment, is a fin-type based selector structure as will be described later.

The resistive memory element may be employed for storing information, corresponding to a bit of a memory cell. The resistive element includes, for example, a programmable resistive layer 140. The programmable resistive layer can be in a first or second resistive state. In one embodiment, the first state is a high resistive state (HRS) and the second state is a low resistive state (LRS). One of the resistive states represents a logic "0" while the other resistive state represents a logic "1". For example, the FIRS may represent a logic 0 while the LRS may represent a logic 1. Having FIRS to represent a logic 1 and LRS to represent a logic 0 may also be useful. Other configurations of data storage for the memory cells may also be useful.

The memory array disposed in the first region 102 is in communication with one or more logic components which serve as peripheral circuit disposed in the second region 104. In one embodiment, the one or more logic components include fin-type based CMOS devices. As shown, a metal line of an upper metal level (e.g., M1) is coupled to contact regions, such as gate, source and drain regions, of the fin-type based logic component having fin structure 115. Although one logic region is shown, it is understood that the substrate may include other suitable number of logic regions for accommodating other types of logic transistors, including non fin-type based logic transistors.

Referring to FIGS. 1a-1d, the device includes a substrate 108. The substrate may be a silicon substrate. The substrate may be lightly doped with, for example, p-type dopants. Providing other suitable types of substrates, including SiGe, Ge and group III-V semiconductors such as GaAs, InP and InAs, including substrates doped with other types of dopants or undoped substrates, are also useful. Other suitable types of substrate, such as crystalline-on-insulator which includes silicon-on-insulator (SOI) type of substrate, may also be useful.

As shown, the substrate 108 is prepared with at least a first region 102 for accommodating a plurality of MTP RRAM cells 105 and a second region 104 for accommodating a plurality of logic transistors 107. The substrate may also include other device regions (not shown) for accommodating other types of devices. The memory cells and logic transistors, in one embodiment, are fin-type based devices. The substrate, as shown, includes a plurality of fin structures 115 disposed in the first and second regions. The fin structures may be an integral part of the substrate. In such cases, the fin structure has the same material as the substrate. Alternatively, the fin structures may be an epitaxial layer formed and processed on the surface of the substrate. In such case, the fin structure may be of the same or different material than that of the substrate. Other suitable configurations of the fin structure may also be useful. An isolation layer 112 is disposed on a surface of the substrate to isolate the device regions and the fin structures from each other. The isolation layer includes a dielectric material, such as a silicon oxide. Other suitable types of dielectric material may also be useful. The isolation layer, for example, has a height or thickness sufficient to provide isolation from the substrate below and between adjacent fin structures. The thickness T1 of the isolation layer, for example, may be about 50-500 nm. Other suitable thickness ranges may also be useful.

The fin structure 115, for example, extends from the top surface of the substrate to above and beyond the top surface 112a of the isolation layer 112. The fin structure, for example, is an elongated member disposed along the first direction (e.g., x direction). The fin structure has sufficient length to include body or channel regions (e.g., regions over which a metal gate will be disposed thereon) and non-channel regions (e.g., contact regions of the memory cell or logic transistor). The height of the fin structure should be sufficient to provide top and bottom fin portions which serve as a part of the selector element in the first region and body of the logic transistor in the second region. The height of the fin, for example, may be about 40-50 nm. As for the width, it may be about 5-30 nm. Other suitable fin dimensions may also be useful. As shown, the fin structure has a top fin portion 115a which protrudes beyond the top surface 112a of the isolation layer and a bottom fin portion 115b which is embedded within the isolation layer.

Doped wells 110 are disposed in the substrate under the fin structures in the first and second regions. In one embodiment, the doped wells in the first region may serve as wordlines (WLs) for the MTP RRAM cells while the doped well in the second region serves as a body well for the logic transistor. The doped wells which serve as WLs are separated from each other by a material of the substrate 108 disposed in between the adjacent WLs. The fin structure may be doped with the same polarity type of dopants as the doped wells. For example, the fin structures may be doped with n-type or p-type dopants. P-type dopants can include boron (B), fluorine (F), aluminum (Al), indium (In) or a combination thereof, while n-type dopants can include phosphorus (P), arsenic (As), antimony (Sb) or a combination thereof. The fin structures and doped wells 110, in one embodiment, are heavily doped with n-type or p-type dopants. The dopant concentration is, for example, about $10^{18}$-$10^{20}$ atoms/cm$^3$. Other suitable configurations and dopant concentrations of the fin structure and doped well may also be useful.

First and second semiconductor layers are disposed over the fin structures in the first region 102 while a first semiconductor layer is disposed over the fin structure in the second region 104. For example, the first semiconductor layer 120 is disposed over the exposed top fin portion in the first and second regions 102 and 104 and the second semiconductor layer 130 is disposed over the first semiconductor layer in the first region 102. The first and second semiconductor layers include epitaxially grown layers. The first and second semiconductor layers 120 and 130 may include opposite polarity type dopants. For example, the first semiconductor layer includes second polarity type dopants and the second semiconductor layer includes first polarity type dopants. The first polarity type may be n-type and the second polarity type may be p-type. Other configurations of first and second semiconductor layers may also be useful. In one embodiment, the second semiconductor layer 130 and the fin structure 115 include the same polarity type dopants. For example, the second semiconductor layer includes n-type dopants for an n-type doped fin structure. The first and second semiconductor layers, in one embodiment, are heavily doped epitaxial layers. The dopant concentration of each epitaxial layer is, for example, about $10^{18}$-$10^{20}$ atoms/cm$^3$. Other suitable dopant concentrations may also be useful.

As described above, each memory cell 105 includes a selector element coupled in series to a memory or storage element. In one embodiment, the selector element includes a fin-type based bipolar selector. In one embodiment, the combination of the fin structure 115, first semiconductor layer 120 and second semiconductor layer 130 in the first region forms an NPN or PNP selector element 135 for a memory cell 105. The selector element 135, for example, may be configured as an NPN or a PNP selector element depending on the dopant types of the fin structure 115 and the semiconductor layers 120 and 130.

As for the storage element, it is disposed over the selector element. Generally, a bottom electrode couples the storage element to the selector element. In one embodiment, the storage element is disposed on top of the second semiconductor layer 130 of the selector element as shown in FIG. 1*b*. In such case, the second semiconductor layer 130, for example, may also function as a bottom electrode of the memory cell. In one embodiment, the storage element includes a programmable resistive stack. The resistive stack, for example, includes a programmable resistive layer 140 and an electrode layer 145 which serves as a top electrode of the memory cell. For example, the storage element of the memory cell includes a programmable resistive layer disposed between top and bottom electrodes. As shown, the programmable resistive layer 140 is coupled to the selector element 135 of the memory cell. This forms a one selector-one resistor (1S1R) RRAM cell, such as a PNP-1R or an NPN-1R RRAM cell.

The programmable resistive layer 140, as shown, separates the top electrode 145 from the second semiconductor layer 130 of the selector element. In one embodiment, the programmable resistive layer 140 wraps around the top electrode 145. For example, the programmable resistive layer lines the sidewalls and bottom of the top electrode. The programmable resistive layer, in one embodiment, does not extend to adjacent fin structures. The width of the storage element may be about a width of the selector element. For example, the sidewalls of the resistive layer is about aligned with the sidewalls of the second semiconductor layer. Other suitable configurations of the storage and selector elements of the memory cell may also be useful.

In one embodiment, the resistive stack includes a metal top electrode and high-k programmable resistive layer. For example, the top electrode 145 may include materials such as TaN or TiN. Other suitable types of metal material may also be useful. As for the programmable resistive layer 140, it includes a programmable resistive material that creates conduction paths or filaments when subjected to a forming procedure. Generally, the forming procedure is performed on a new device that has not yet been operated. During programming operation, the filaments can be reset or broken by subjecting the programmable resistive layer to a reset procedure or condition; the filaments can be set or re-formed by subjecting the programmable resistive layer to a set procedure or condition as will be described later. Once set or reset, the state of the resistor is stable until reset or set. The programmable resistive layer includes a high-k dielectric layer. A high-k dielectric layer, for example, includes $HfO_2$, HfSiON, $La_2O_3$, zirconium oxide or silicates thereof. Other suitable types of high-k material may also be useful.

As for the second region 104, it includes a logic transistor 107 having a fin structure 115 formed over the substrate 108 as shown in FIG. 1*d*. In one embodiment, a gate 150 is disposed on the substrate. The gate, for example, is an elongated member with a rectangular cross-section. Other types of gates may also be useful. In one embodiment, the gate is disposed on the substrate along a second direction (e.g., y direction) and traverses the fin. The second direction, for example, is perpendicular to the first direction. The gate, for example, wraps around the fin.

The gate 150, in one embodiment, includes a gate electrode and a gate dielectric. The gate dielectric layer, for example, is disposed between the gate electrode and the fin structure. In one embodiment, the gate electrode includes the same material as the top electrode 145 of the memory cell while the gate dielectric 140 includes the same material as the programmable resistive layer of the memory cell. In other embodiments, the gate dielectric and the gate electrode of the logic transistor in the second region may include materials different than the programmable resistive and top electrode of the memory cell.

Dielectric spacers 128 may be provided on sidewalls of the gate in the second region. The dielectric spacers, for example, may be silicon nitride. Other types of dielectric materials may also be used. For example, the spacers may be silicon nitride or multiple layers of dielectric materials, such as silicon oxide and silicon nitride.

First and second source/drain (S/D) regions 122 are disposed over the fin structure 115 and adjacent to first and second sides of the gate 150 in the second region 104. A channel 156 is located in the upper portion of the fin between the S/D regions and below the gate. The S/D regions, in one embodiment, are raised or elevated S/D regions. The raised S/D regions, in one embodiment, include the same material and dopant type as the first semiconductor layer or the second semiconductor layer of the selector element in the first region 102 depending on whether the logic transistor is a first or second polarity type transistor. For example, the raised S/D regions may contain n-type dopants for an n-type or n-channel device or p-type dopants for a p-type or p-channel device. The raised S/D regions, in one embodiment, are heavily doped regions. For example, the dopant concentration of the S/D regions may be about $10^{18}$-$10^{20}$ atoms/cm$^3$.

A dielectric layer 180 is disposed over the substrate. It is understood that there may be additional layers between the dielectric layer and the substrate, such as an etch stop layer. The dielectric layer may be an inter level dielectric (ILD) level. The dielectric layer, for example, serves as a first contact level of a lower ILD level. The first contact level may be referred to as a pre-metal dielectric (PMD) layer or contact level (CA). The dielectric layer may be, for example, silicon oxide. Other types of dielectric layers which may serve as the PMD layer may also be used. Contact plugs 185 or via plugs are disposed in the CA layer and are coupled to contact regions of the memory cell in the first region and contact regions of the logic transistor in the second region. The contact regions, for example, include the well tap regions (not shown) of the doped wells 110, top electrode 145, raised S/D regions 122 and gate 150. The contact plugs, for example, include conductive material such as tungsten, copper, or alloy thereof. Other suitable conductive materials may also be useful. Additional dielectric layers may be formed over the PMD layer to form upper ILD levels. These additional dielectric layers include interconnect metal levels having via contacts and conductive/metal lines formed therein. The device may include multiple interconnect levels. The interconnects, for example, provide connections to the contact regions of the device. For example, contact plugs (not shown) couple the well tap regions (not shown) which connect the doped wells (e.g., wordlines) of the memory cell to metal lines disposed in upper metal level while contact plugs 185 couple the top electrode 145 of the memory cell to conductive lines 190 which serve as BLs disposed in an upper metal level. Conductive lines 190 which serve as BLs of an array, as shown, are provided in a first metal level (M1) in an upper ILD layer above the PMD layer and are coupled to the contact plugs 185. Providing BLs in other metal levels may also be useful. As for the second region, contact plugs couple the S/D regions 122 and gate 150 of the logic transistor to metal lines disposed in upper metal level. The metal level, for example, may be the first metal level M1.

Figure 2B:
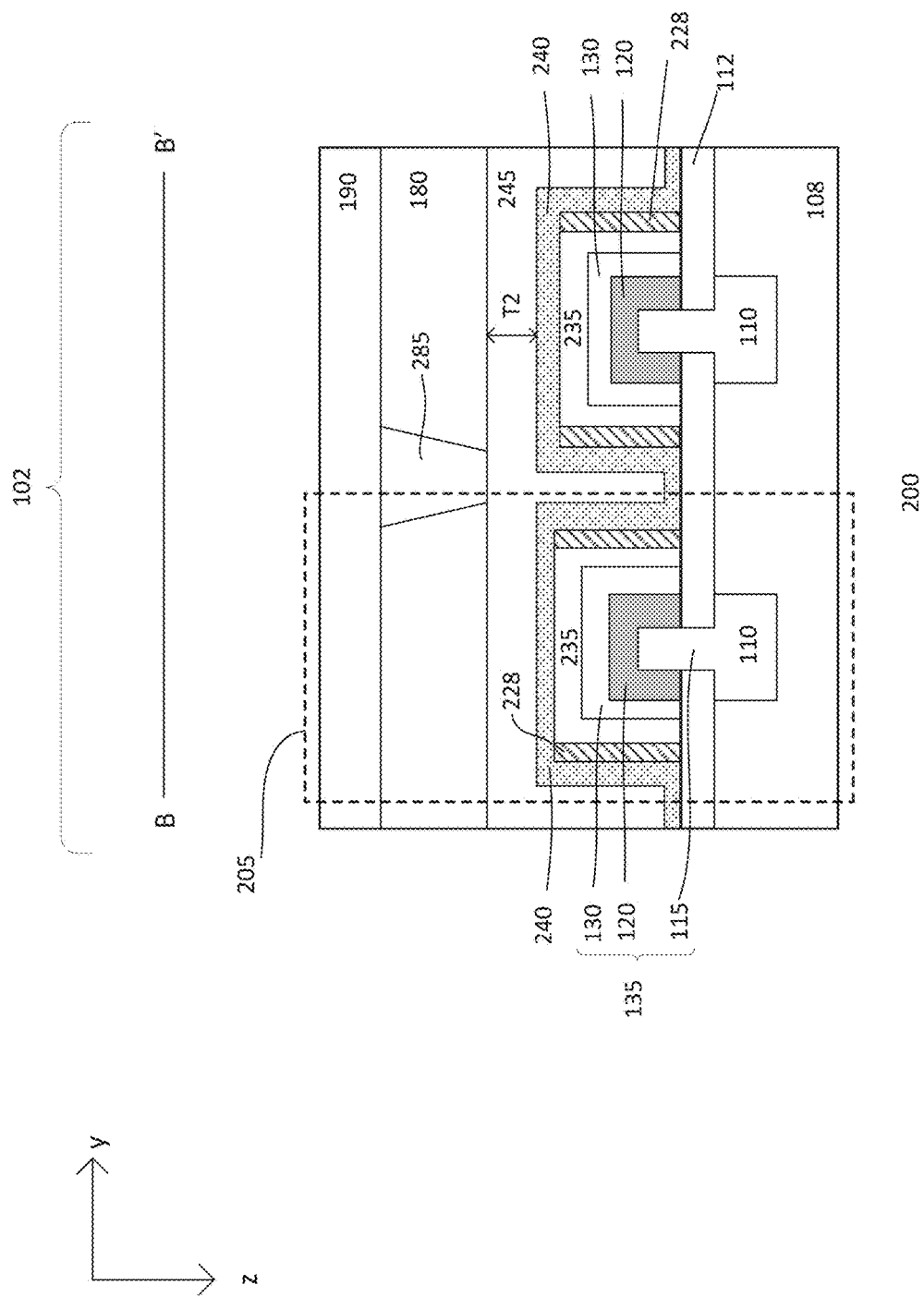
Figure 2C:
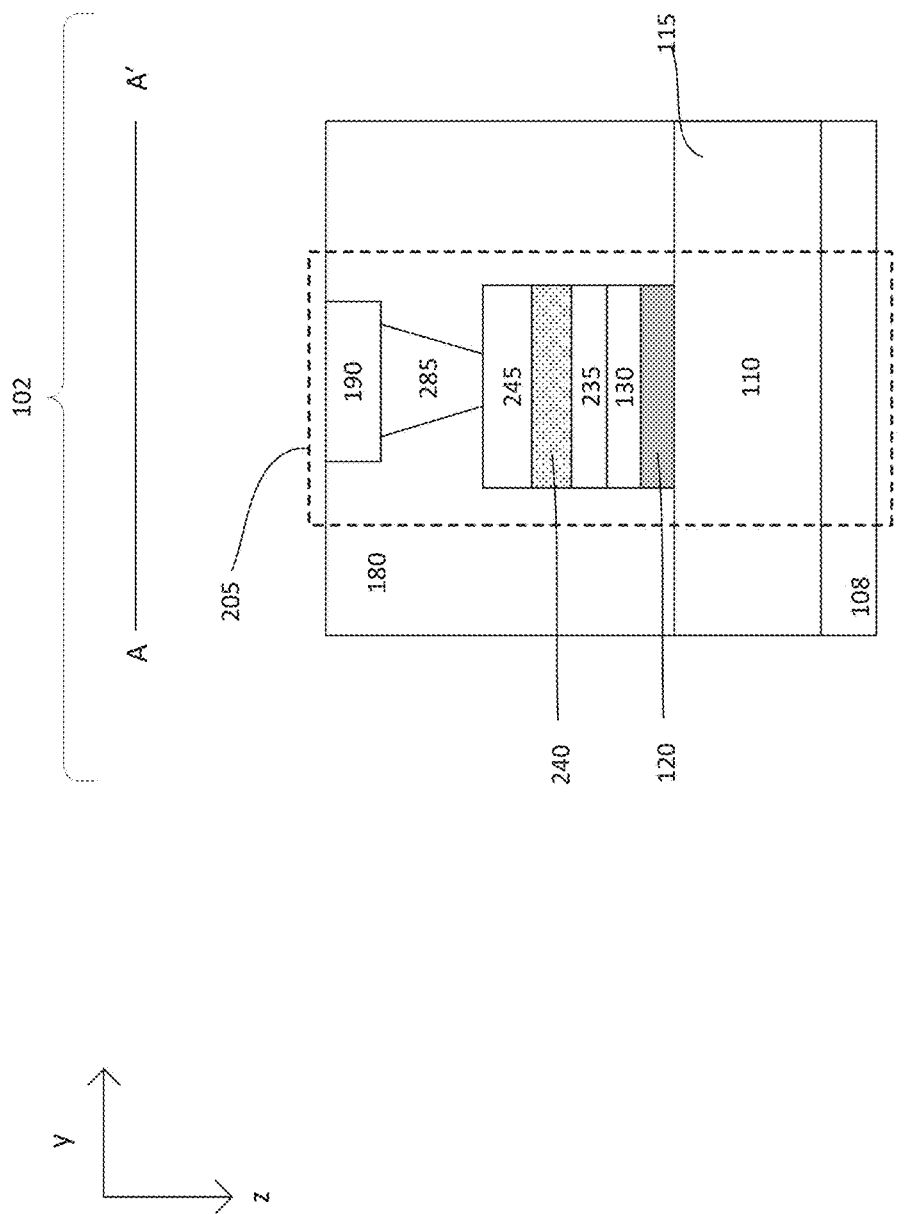

FIGS. 2a-2c show various views of another embodiment of a device 200. FIG. 2a shows a simplified top view of a cross-bar memory array 203 in a first region 102 while FIGS. 2b-2c show corresponding cross-sectional views. FIG. 2b shows a cross-sectional view of the first region of the device taken along B-B' and FIG. 2c shows a cross-sectional view of the first region of the device taken along A-A'. The device 200 is similar to the device 100 as described in FIGS. 1a-1c, except that the second (or logic) region of the device is not shown. Common elements may not be described or described in detail. In the interest of brevity, the description of the illustrations shown in FIGS. 2a-2c below primarily focuses on the difference(s) compared with the illustrations shown in FIGS. 1a-1c.

The device 200 includes a substrate 108 having one or more fin structures 115 and doped wells 110 for the memory cell 205 in the first region. The doped wells 110 which serve as WLs are separated from each other by material of the substrate 108 disposed in between the adjacent WLs. Each memory cell 205 of the device 200 includes a selector element coupled in series to a memory element. For example, the selector element serves as a cell selector and the memory element serves as a storage element of the memory cell. In one embodiment, the memory element is a resistive memory element, forming a RRAM cell 205. In one embodiment, the selector element includes a bipolar selector 135. The bipolar selector, in one embodiment, is a fin-type based selector, which is the same as that described in FIGS. 1a-1c. For example, the combination of the fin structure 115, first semiconductor layer 120 and second semiconductor layer 130 forms a selector element 135 for a memory cell 205. In one embodiment, the fin structure and the second semiconductor layer may include first polarity type dopants while the first semiconductor layer may include second polarity type dopants opposite to the first polarity type. For example, the fin structure and the second semiconductor layer may include n-type dopants while the first semiconductor layer may include p-type dopants to form an NPN selector. Alternatively, the fin structure and the second semiconductor layer may include p-type dopants while the first semiconductor layer may include n-type dopants to form a PNP selector. The selector, for example, may be configured as an NPN or PNP selector depending on the dopant types of the fin structure and the first and second semiconductor layers.

A storage element which includes a programmable resistive stack is disposed over the selector element. In one embodiment, the device 200 differs from the device 100 in that the programmable resistive stack of device 200 includes a first electrode layer 235 disposed on the second semiconductor layer of the selector. The first electrode layer 235 serves as the bottom electrode. In one embodiment, the first electrode layer includes a metal layer. The metal electrode layer, for example, includes materials such as TaN or TiN. Other suitable materials may also be useful.

Dielectric spacers 228 may be disposed on first and second sidewalls of the bottom electrode 235. The dielectric spacers, for example, may be formed of silicon oxide. Other suitable types of dielectric materials may also be used. For example, the spacers may be silicon nitride or multiple layers of dielectric materials, such as silicon oxide and silicon nitride.

A programmable resistive layer 240 of the programmable resistive stack is disposed over the selector elements of the memory array. The programmable resistive layer 240 includes the same material as the programmable resistive layer 140. In one embodiment, the programmable resistive layer 240 is a common resistive layer of the memory array. For example, the resistive layer extends across the columns and rows of memory cells. The resistive layer, for example, is in electrical communication with the selector element of each memory cell of the array. Other configurations of the resistive layer may also be useful. In one embodiment, the resistive layer lines the top surface of the isolation layer and wraps around the first electrode layer (or bottom electrode). For example, the resistive layer lines the dielectric spacers and the exposed top surface of the bottom electrode. The resistive layer is in electrical communication with the bottom electrode through the exposed top surface of the bottom electrode while dielectric spacers electrically isolate the sides of the bottom electrode from the portion of the resistive layer thereover. This produces localized resistor regions where filaments will be formed along portions of the programmable resistive layer over exposed top surface of the bottom electrode which improves resistance distribution of memory cells of the array.

The programmable resistive stack includes a second electrode layer 245 disposed over the programmable resistive layer 240. The second electrode layer includes a metal layer. The second electrode layer, for example, includes the same material as the first electrode layer. Other suitable materials may also be useful. The second electrode layer serves as the top electrode. In one embodiment, the second electrode layer extends along a column of memory cells and traverses the fin-type based selector elements along the column. In this case, each column of memory cells shares a common top electrode layer. Thus, the top electrode layer serves as a common top electrode layer of a column of the array. The second electrode layer, for example, fills the spaces between vertical portions of the resistive layer 240 and encompasses the selector elements. The second electrode layer may include a thickness over the resistive layer. For example, the thickness of the second electrode layer T2 over the resistive layer is about 50-100 nm. Other suitable thicknesses may also be useful.

A dielectric layer 180 is disposed over the substrate. The dielectric layer may serve as an ILD level. The dielectric layer, for example, serves as a first contact level of a lower ILD level. The first contact level may be referred to as a PMD layer or CA level. The dielectric layer may be, for example, silicon oxide. Other types of dielectric layers which may serve as the PMD layer may also be useful. As shown, a contact plug 285 or via plug may be disposed in the CA level. The contact plug may be a common plug coupled to the top electrode of each column of memory cells of an array. For example, each column of memory cells includes a common top electrode coupled to a common contact plug. Additional dielectric layers may be formed over the PMD layer to form upper ILD levels. These additional dielectric layers include interconnect metal levels having via contacts and conductive/metal lines formed therein. The device may include multiple interconnect levels. The interconnects, for example, provide connections to the contact regions of the device.

In one embodiment, conductive lines 190 may be provided in a metal level of an upper ILD layer above the PMD layer. The metal level may be a first metal level M1. As shown, each column of memory cells includes a common contact plug 285 electrically coupling a common top electrode to a conductive line 190 which serves as a common BL disposed in M1. Providing BLs disposed in other metal levels may also be useful. Other configurations of ILD layer may also be useful. Contact plugs and conductive lines may be formed of metal, such as copper, copper alloy, aluminum, tungsten or a combination thereof. Other suitable types of metal, alloys or conductive materials may also be useful.

The plurality of memory cells 105 or 205 may be interconnected by WLs and BLs to form an array 103 or 203 as shown in FIG. 1*a* and FIG. 2*a*. In one embodiment, the array is a cross-bar memory array. For example, a memory cell is disposed at the crossing points of first and second conductive lines. For example, the memory array includes a cross-point memory array of RRAM memory cells. A memory cell may be selected or accessed by applying appropriate voltage signals to WLs and BLs of the array. An active signal applied at a WL selects a row of cells associated with the activated WL. To select a cell within the row of the activated WL, appropriate voltages are provided at the BL associated with the selected cell. When a memory cell is selected, its respective selector element is forward biased, allowing current to flow through. In contrast, the selector element of an unselected memory cell is reverse biased. This prevents current from flowing through an unselected memory cell. The array may be configured to access multiple cells simultaneously. Furthermore, the array may be sub-divided into a plurality of blocks of memory cells. Other configurations of accessing cells in the array may also be useful. A memory cell access may include various signals applied to the contact regions of the memory cell, depending on the desired operation and the cell to access. For example, a memory access may include different types of operations, such as forming, set, reset and read operations.

FIGS. 3*a*-3*j* show cross-sectional views of an embodiment of a process 300 of forming a device or IC. Figures with a subscript 1 relate to cross-sectional views of the second (or logic) region 104 taken along the x-z direction while figures with a subscript 2 relate to corresponding cross-sectional views of the first (or memory) region 102 taken along the y-z direction. The device formed by process 300 is similar or the same as the device 100 as described in FIGS. 1*a*-1*d*. Common elements may not be described or described in detail.

FIGS. 3*a*$_1$-3*a*$_2$ depict a substrate 108 prepared with the first and second device regions 102 and 104. In one embodiment, the first device region 102 accommodates a plurality of memory cells and the second device region 104 accommodates one or more logic devices which serve as peripheral circuit for the memory cells. Although the device is described with first and second active device regions, it is understood that the same substrate may include numerous active device regions (not shown). The numerous active device regions may accommodate different types of devices.

The substrate 108 may be a silicon substrate. The substrate may be lightly doped with second polarity type dopants, such as, p-type dopants. Providing other suitable types of substrates, including SiGe, Ge and group III-V semiconductors such as GaAs, InP and InAs, including substrates doped with other types of dopants or undoped substrates, are also useful. Other suitable types of substrate, such as crystalline-on-insulator which includes SOI type of substrate, may also be useful.

The substrate 108 is processed to form fin structures 115. In one embodiment, a fin structure 115 has sufficient length to accommodate the body or channel and non-channel regions of the logic transistor and memory cell, such as that described in, for example, FIGS. 1*a*-1*d*. The height of the fin structure should be sufficient to provide top and bottom fin portions which serve as a part of the selector element in the first region and body of the logic transistor in the second region. The height of the fin, for example, may be about 40-50 nm. As for the width, it may be about 5-30 nm. Other suitable fin dimensions may also be useful.

Forming the fin structures may be achieved using various methods. The fin structure, in one example, may be formed by patterning the substrate. For example, a patterned hard mask (not shown) is formed over the substrate. In one embodiment, a hard mask layer (not shown), such as silicon oxide or silicon nitride, is formed on the substrate 108. Other suitable types of materials which are selective to the isolation layer as will be described later may also be used as the hard mask layer. The hard mask layer may be formed by chemical vapor deposition (CVD). Other suitable types of hard mask or techniques for forming the hard mask may also be useful.

The hard mask layer is patterned to correspond to the shape of the fin structures. The patterning of the hard mask layer can be achieved by mask and etch techniques. For example, a patterned soft mask (not shown), such as photoresist, may be used as an etch mask to pattern the hard mask layer. The soft mask may be patterned by photolithography. To improve lithographic resolution, an anti-reflective coating ARC (not shown) may be provided beneath the photoresist. The pattern of the photoresist is transferred to the hard mask by, for example, an anisotropic etch, such as a reactive ion etch (ME). The soft mask is removed. An anisotropic etch, such as RIE, is performed to remove portions of the substrate surface unprotected by the hard mask, leaving fin structures 115 in the first and second regions 102 and 104 disposed on the top surface of the substrate. Other suitable methods may also be employed to form the fin structure. Although two fin structures are shown to be formed in the first region 102, it is understood that other suitable number of fin structures may be formed on the same substrate 108.

The process continues to form an isolation layer 112. The isolation layer, such as a dielectric layer which includes a silicon oxide layer, is formed over the substrate 108 covering the fin structures 115 in the first region 102 and second region 104 (isolation layer not shown in the second region). Other suitable types of dielectric layer may also be useful. The isolation layer, for example, may be formed over the substrate using chemical vapor deposition (CVD) or high aspect ratio process (HARP). Other suitable techniques for forming the isolation layer may also be useful. In one embodiment, a polishing process, such as a chemical mechanical polishing process (CMP) is performed to planarize the isolation layer to the top surface of the hard mask (not shown) over the fin structures. A removal process, such as that selective to the isolation layer which includes oxide material, is performed to remove or recess portions of the oxide to form the isolation layer 112 as shown in FIG. 3a2. The removal process may include dry etch, wet etch or a combination thereof. The isolation layer, for example, has a height or thickness sufficient to provide isolation from the substrate below and between adjacent fin structures. For example, the isolation layer is recessed to a thickness which is less than the height of the fin structures. As shown, the fin structure has a top fin portion 115a which protrudes beyond the top surface 112a of the isolation layer and a bottom fin portion 115b which is embedded within the isolation layer. The thickness T1 of the isolation layer, for example, may be about 50-500 nm. Other suitable thickness ranges may also be useful.

Doped wells 110 are formed in the first and second regions 102 and 104 of the substrate. The doped wells include first polarity type dopants for a second polarity type substrate. For example, the first polarity type is n-type and the second polarity type is p-type. Other configurations of doped wells and substrate may also be useful. For example, the first polarity type may be p-type and the second polarity type may be n-type. In one embodiment, the doped wells include first polarity type dopants, such as n-type dopants, forming n-type doped wells. In one embodiment, the doped wells are formed to a depth greater than the bottom of the isolation layer. The doped wells may be formed by ion implantation having dopant concentration of about $10^{18}$-$10^{20}$ atoms/cm$^3$. Other suitable dopant concentrations may also be useful. An implant mask may be used to facilitate forming the doped wells. A patterned photoresist may be used as the implant mask. In one embodiment, the doped wells 110 in the first region serve as wordlines (WLs) for the MTP RRAM cells. In other embodiments, the doped wells in the first region may serve as bitlines (BLs) for the MTP RRAM cells.

Referring to FIGS. $3b_1$-$3b_2$, the process continues to form dummy gates 325 over the second region 104. For example, a dummy gate dielectric layer and a dummy gate electrode layer are conformally formed over the substrate in the first and second regions covering the fin structures. In the case of a dummy gate, it may be formed of any type of material which can be selectively removed from the fin and a subsequently formed dielectric layer. For example, the dummy gate electrode layer may include polysilicon while the dummy gate dielectric layer may include silicon nitride or silicon oxide. Other suitable types of materials may also be used for the dummy gate layers. The dummy gate dielectric and dummy gate electrode layers are patterned to form a patterned gate dielectric 318 and patterned gate electrode 320 which serve as a dummy gate 325 in the second (or logic) region 104. For example, suitable mask and etch techniques may be employed to remove exposed portions of the dummy gate dielectric and dummy gate electrode layers from the first (or memory) region 102 while dummy gate dielectric and dummy gate electrode layers protected by the mask remain and serve as the dummy gate 325 in the second region 104. The dummy gate layers, for example, wrap around and traverse the channel regions of the fin structures 115 in the second region 104.

Referring to FIGS. $3c_1$-$3c_2$, the process continues to form sidewall spacers 128 on the dummy gate sidewalls. Optionally, the process may continue to form lightly doped drain (LDD) regions before forming the gate sidewall spacers. For example, second polarity type LDD regions are formed in the second region 104 adjacent to first and second sides of the dummy gate by ion implantation process. To form the lightly doped regions, second polarity type dopants, such as p-type dopants, are implanted into the substrate within the doped well. The implant, for example, may be self-aligned with respect to the dummy gates. For example, the implant may dope the substrate unprotected by the dummy gates and isolation layer. Other techniques to form the lightly doped regions may also be useful.

Sidewall spacers 128 may be formed on the dummy gate sidewalls. The sidewall spacers, for example, include silicon nitride. Other types of spacer materials, such as silicon oxide or silicon oxynitride, may also be useful. To form sidewall spacers, a spacer dielectric layer is deposited on the substrate. The spacers can be formed by using various techniques, such as plasma enhanced chemical vapor deposition (PECVD). Other techniques for forming the spacer dielectric layer or forming other types of spacers may also be useful. The spacer dielectric layer is anisotropically etched, such as by RIE, to remove horizontal portions, leaving non-horizontal portions on the sidewalls of the dummy gate 325 as the spacers 128.

Referring to FIGS. $3d_1$-$3d_2$, the process continues to integrate forming 1S1R memory cell structures in the first region 102 using CMOS logic processing. In one embodiment, the process continues to form first and second semiconductor layers of opposite polarity types on the substrate. The first semiconductor layer is formed by, for example, selective epitaxial growth (SEG) process. In one embodiment, the first epitaxial layer 120 of the memory cell structures may be formed as part of the process for forming second polarity type epitaxial raised or elevated S/D regions 122 of logic transistors in the logic region 104 on the same substrate 108. For example, the first epitaxial layer 120 in the first region 102 may be formed as part of the process for forming second polarity type raised S/D regions 122 adjacent to the dummy gates 325 in the second region 104. In such case, the first semiconductor layer 120 includes a first epitaxial layer formed by SEG process which wraps around the exposed top fin portions. The SEG selectively forms crystalline epitaxial layer on the entire exposed top fin portion of the fin structures in the first region 102 and forms crystalline epitaxial layer on exposed top fin portion of the fin structures not shielded by the dummy gates 325 in the second region 104.

The first semiconductor or epitaxial layer 120, in one embodiment, is in-situ heavily doped with second polarity type dopants. For example, the second polarity type is p-type. Heavily doping the first epitaxial layer by ion implantation using an implant mask may also be useful. In such case, portions of the first semiconductor layer not covered by the implant mask may be heavily doped with second polarity type dopants using ion implantation technique. The thickness of the first semiconductor layer is, for example, about 5-10 nm and the concentration of the second polarity type dopants in the first semiconductor layer is about $10^{18}$-$10^{20}$ atoms/cm$^3$. Other suitable thicknesses and dopant concentrations may also be useful.

Referring to FIGS. $3e_1$-$3e_2$, a second semiconductor layer 130 is formed on the substrate. In one embodiment, the second semiconductor layer is formed by, for example, SEG process. In one embodiment, the second semiconductor layer 130 formed over the first semiconductor layer 120 in the first region 102 may be formed as part of the process for forming first polarity type epitaxial raised or elevated S/D regions of logic transistors in other logic regions (not shown) on the same substrate. In such case, the second semiconductor layer 130 includes a second epitaxial layer formed by SEG process which wraps around the exposed first semiconductor layer 120 in the first region 102 while the second region 104 is protected by a protective mask (not shown). The SEG selectively forms second crystalline epitaxial layer on the entire exposed first semiconductor layer in the first region 102 while the first semiconductor layer in the second region 104 is covered and protected by the protective mask (not shown).

The second semiconductor or epitaxial layer 130, in one embodiment, is in-situ heavily doped with first polarity type dopants. For example, the first polarity type is n-type. Heavily doping the second epitaxial layer by ion implantation using an implant mask may also be useful. In such case, exposed portions of the second semiconductor layer not covered by the implant mask may be heavily doped with first polarity type dopants using ion implantation technique. The thickness of the second semiconductor layer is, for example, about 5-20 nm and the concentration of the first polarity type dopants in the second semiconductor layer is about $10^{18}$-$10^{20}$ atoms/cm$^3$. Other suitable thicknesses and dopant concentrations may also be useful. The protective mask covering the second region 104 may be removed. As shown, the fin structure 115 doped with first polarity type dopants, the first semiconductor layer 120 doped with second polarity type dopants and the second semiconductor layer 130 doped with first polarity type dopants, in combination, forms the selector element 135 of the memory cell in the first region 102.

Referring to FIGS. $3f_1$-$3f_2$, metal silicide contacts (not shown) may be formed on contact regions of the device, such as the well tap and S/D regions, on the same substrate. The silicide contacts, for example, may be nickel-based metal silicide layers. Other suitable types of silicide contacts may also be useful. The silicide contacts facilitate reduced contact resistance. To form silicide contacts, a metal layer may be deposited over the substrate and annealed to cause a reaction with semiconductor material, such as silicon. Unreacted metal is removed by, for example, a wet etch, leaving the silicide contacts on the contact regions.

An interlevel dielectric (ILD) layer 380 is formed over the substrate, covering the dummy gates, raised S/D regions, isolation layer and selector diodes. The ILD layer, for example, may be a silicon oxide layer formed by CVD. Other suitable types of ILD layer or forming techniques may also be useful. Excess dielectric material of the ILD layer is removed by a planarization process, such as CMP. Other types of planarization processes may also be useful. The CMP, in one embodiment, may use the dummy gates as a CMP stop. For example, the CMP forms a substantially coplanar top surface between the top surfaces of the dummy gates, sidewall spacers and ILD layer in the second region 104 as shown in FIG. 3fi and forms an ILD layer with a substantially planar top surface over the first region 102 as shown in FIG. 3f2.

Referring to FIGS. $3g_1$-$3g_2$, trenches 345 are formed in the first region 102, exposing the top surface of the second semiconductor layer 130 of the selector elements. The trenches may be formed using mask and etch techniques. To form the trenches, a patterned mask (not shown) may be used. The mask is, for example, a photoresist mask. To improve lithographic resolution, an ARC may be provided between the ILD layer and mask. The mask is patterned to form trenches over the selector element of the memory cells in the first region 102 while the second region 104 is covered and protected by the patterned mask. The exposed portions of the ILD layer not covered by the patterned mask, for example, are removed using RIE technique. As shown in FIG. $3g2$, the sidewalls of the trenches 345 are about aligned with the sidewalls of the second epitaxial layer 130 to expose the top surface of the second epitaxial layer. The patterned mask may be removed after forming the trenches.

Referring to FIGS. $3h_1$-$3h_2$, the exposed dummy gates 325 over the second region 104 are removed. Removal of the dummy gates may be performed by mask and etch techniques. In one embodiment, a patterned mask (not shown) exposes the dummy gates to a suitable etchant while the first region 102 is covered and protected by the patterned mask. For example, a wet etch selective to the dielectric layer 380 and sidewall spacers 128 may be performed. The dummy gates having the gate dielectric and gate electrode may be removed by wet etch using different chemistries. Removal of the dummy gates leaves a gate trench or gate opening 330 on the substrate and exposes portions (e.g., channel regions) of the fin structures 115 and inner sides of the spacers 128 adjacent to the gate trench in the second region 104.

In one embodiment, the process continues to form replacement metal gates over the second region 104. In one embodiment, a replacement metal gate process is performed. The replacement metal gate process forms high-k metal gates 150 in the gate trenches 330 as shown in FIG. $3i_1$. To form the replacement metal gates, a high-k gate dielectric layer 140 is formed on the substrate. The high-k gate dielectric layer conformally lines the gate trenches and ILD layer. The high-k gate dielectric layer, for example, may be HfO$_2$, HfSiON, La$_2$O$_3$, zirconium oxide or silicates thereof formed by atomic layer deposition (ALD) process. A metal gate electrode layer 145, such as TaN or TiN, may be formed over the high-k gate dielectric layer by ALD, CVD or physical vapor deposition (PVD). Other suitable types of gate dielectric materials, metal materials or forming techniques may also be useful.

In one embodiment, the replacement metal gate process which forms the high-k metal gates 150 in the second region 104 also simultaneously forms the storage or memory elements over the selector elements in the first region 102, as shown in FIG. $3i_2$. For example, the same high-k dielectric layer 140 also lines the trenches 345 and ILD layer over the first region 102. The high-k dielectric layer 140 serves as the programmable resistive layer of the resistive stacks of the memory cell. The metal electrode layer 145 is formed over the high-k dielectric layer 140. The metal electrode layer serves as the top electrode of the storage element of the memory cell while the heavily doped second semiconductor layer 130 may also serve as the bottom electrode of the storage element of the memory cell.

The substrate is planarized to remove excess high-k gate dielectric and metal gate electrode materials. For example, the planarization process removes excess materials over the ILD layer. In one embodiment, the planarization process is CMP. Other types of planarization processes may also be useful. The CMP, for example, may use the ILD layer 380 as a CMP stop. The planarization process forms a substantially coplanar top surface between the ILD, high-k gate dielectric and metal gate electrode in the second region 104 and forms a substantially planar top surface between the ILD, top electrode and programmable resistive layer in the first region 102 as shown in FIGS. $3i_1$-$3i_2$.

Referring to FIGS. 3$j_1$-3$j_2$, back-end-of-line (BEOL) processing is performed on the substrate. The BEOL process includes forming additional dielectric layers such as a pre-metal dielectric layer (PMD) in which via contacts are formed and coupled to contact regions of the devices. Additional dielectric layers are, for example, formed similarly as the ILD layer 380.

Via openings are formed in the PMD layer 180 using mask and etch techniques. For example, a patterned resist mask with openings corresponding to the via contacts is formed over the dielectric layer. An anisotropic etch, such as RIE, is performed to form via openings, exposing contact regions below, such as well tap regions, raised S/D regions and gate electrodes in the second region, as well as well top electrodes and well tap regions coupled to wordlines in the first region. A conductive layer is deposited on the substrate, filling the via openings. The conductive layer may include tungsten, copper, or alloy thereof and may be formed by sputtering. Other suitable conductive materials and techniques may also be useful. A planarization process, such as CMP, is performed to remove excess conductive material and form contact plugs 185 in the CA level.

After forming contacts in the CA level, the BEOL process continues to form a dielectric layer over the substrate, covering the CA level dielectric layer. The dielectric layer may be an upper ILD level. The dielectric layer, for example, serves as a first metal level M1 in which conductive or metal lines 190 are formed. The conductive lines interconnect the various components of the IC to perform the desired functions. The conductive lines may be formed of a metal, such as copper, copper alloy, aluminum, tungsten or a combination thereof. Other suitable types of metal, alloys or conductive materials may also be useful.

Conductive lines 190 formed in the M1 level may be formed by a damascene technique. For example, the dielectric layer may be etched to form trenches or openings using, for example, mask and etch techniques. A conductive layer is formed on the substrate, filling the openings. The conductive layer may be formed by, for example, plating, such as electrochemical or electroless plating. Other suitable forming techniques may also be useful. A planarization process, such as CMP, is performed to remove excess conductive material, leaving conductive lines in M1.

As shown, the contacts plugs couple the contact regions or terminals of the CMOS devices and memory cells to the conductive lines in upper ILD level. Contacts to the replacement metal gates (not shown) in the second region 104 may be formed at the end of the gates. Conductive lines in M1 in the first region may function as BLs of the device. Providing the BLs in other suitable metal levels may also be useful. As discussed, the doped wells serve as the WLs and the conductive lines in the first region serve as the BLs. It is understood that the BLs and WLs may be interchangeable.

Additional BEOL processes may be performed to finish the manufacturing of the device, such as forming of one or more interconnect levels, final passivation, dicing, assembly, packaging and testing. Other processes are also useful.

FIGS. 4a-4e show cross-sectional views of another embodiment of a process 400 of forming a device or IC. The process 400 is similar to the process 300 shown in FIGS. 3*a*-3*j*, except that the process performed on the second (or logic) region are not illustrated in FIGS. 4a-4e. The device formed by process 400 is similar or the same as the device 200 as shown and as described in FIGS. 2*a*-2*c*. In the interest of brevity, the description below will focus primarily the difference(s) between the processes 300 and 400 and common elements and processes may not be described or described in detail.

As shown in FIG. 4a, the substrate is processed at the same stage as that described in FIG. 3*e*2. For example, the substrate is processed to form fin structures 115 and doped wells 110 in the substrate below the fin structures in the first and second regions 102 and 104 and isolation layer 112 having thickness less than the height of the fin structures is also formed in the first and second regions to isolate the fin structures. The substrate is also processed to include first and second semiconductor layers 120 and 130 over the top portion of the fin structures in the first and second regions. For example, the fin structures 115 doped with first polarity type dopants, the first semiconductor layer 120 doped with second polarity type dopants and the second semiconductor layer 130 doped with first polarity type dopants, in combination, forms the selector element 135 of a memory cell in the first region 102. The processing of the substrate involve materials and techniques which are similar or the same as those shown from FIG. 3*a* to FIG. 3*e* and their corresponding descriptions and therefore will not be repeated herein.

Figure 4B:
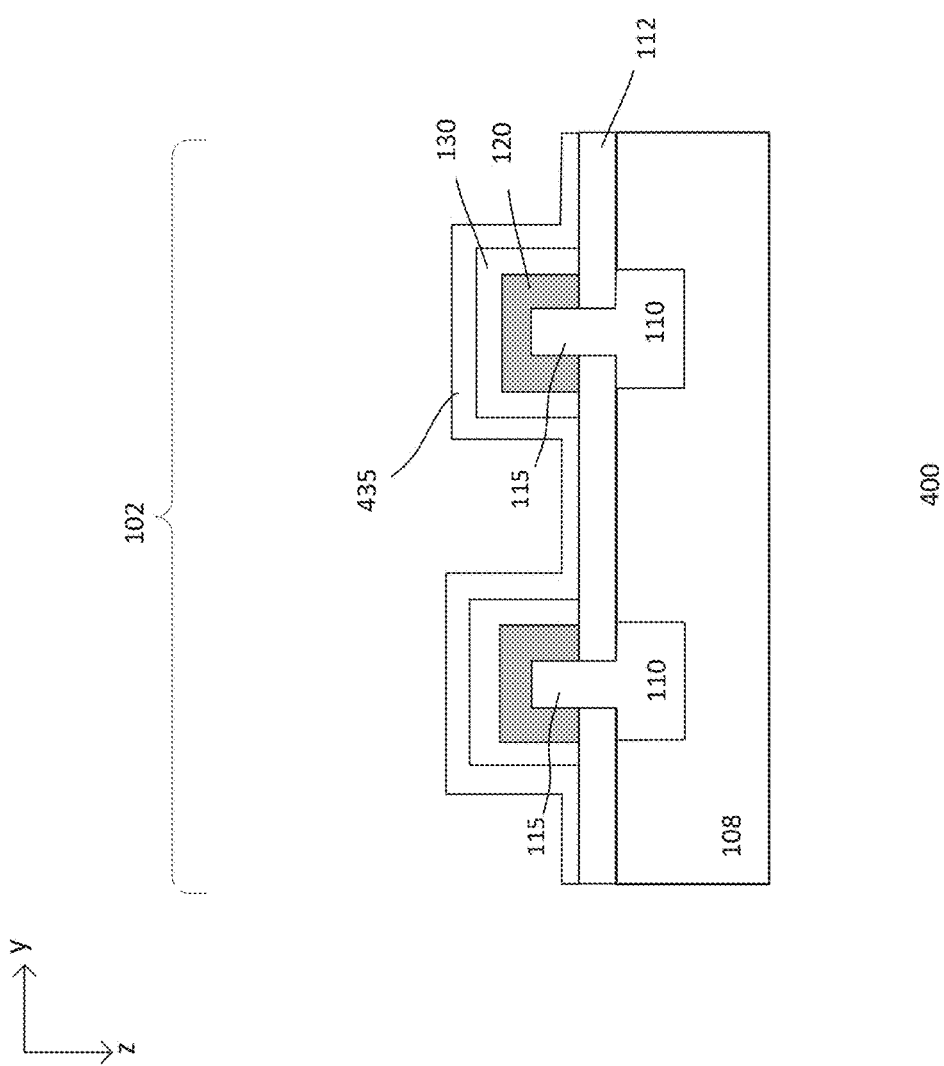

Referring to FIG. 4b, a first electrode layer 435 is conformally formed over the isolation layer 112. The first electrode layer 435, for example, includes metal layer such as TaN or TiN, and is formed over the substrate by ALD, CVD or PVD. In one embodiment, the first electrode layer 435 lines the isolation layer 112 and the second semiconductor layer 130 in the first region 102. For example, the first electrode layer is a common electrode layer covering the storage elements in the first region.

Figure 4C:
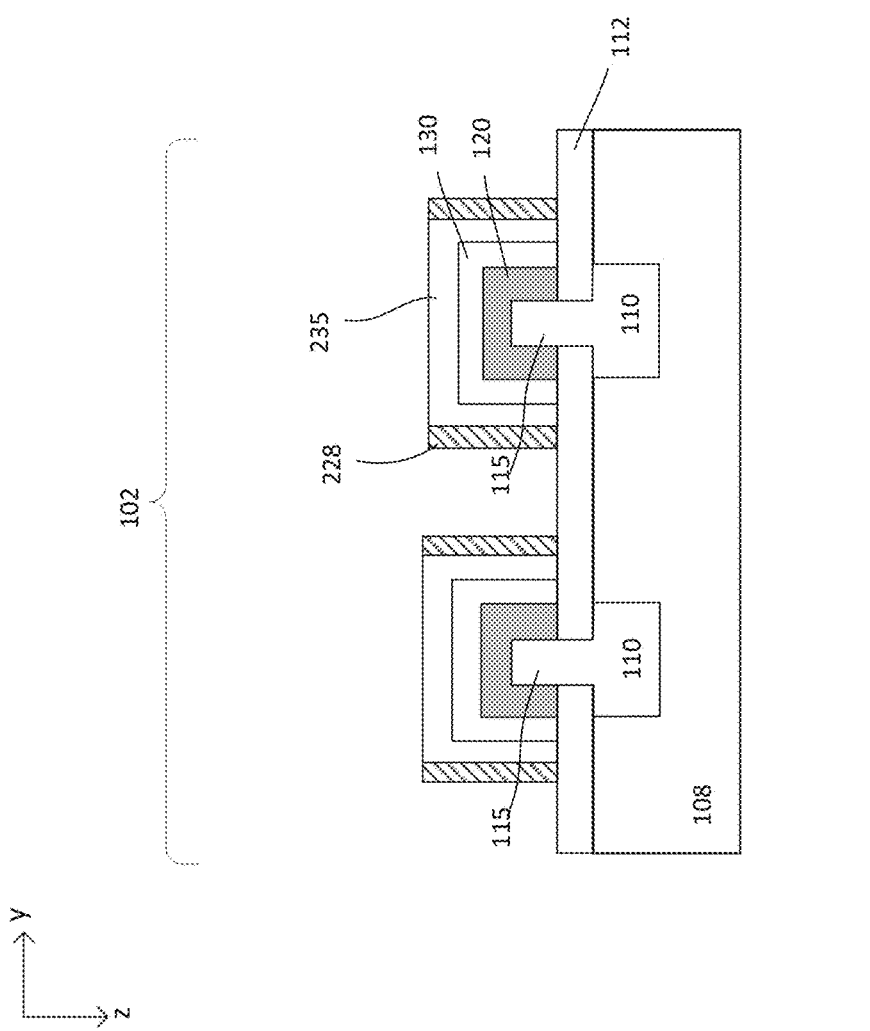

Referring to FIG. 4c, the process continues to pattern the first electrode layer 435. For example, portions of the first electrode layer may be selectively removed. In one embodiment, the first electrode layer may be patterned by suitable mask and etch techniques. For example, the first electrode layer may be etched with an etch mask, such as photoresist, to remove horizontal portions of first electrode layer between selector elements. As shown, the remaining first electrode layer wraps around the sides and top surface of the second semiconductor layer 130 of a selector element. The first electrode layer, for example, serves as a bottom electrode 235 of the storage element of the memory cell.

Sidewall spacers 228 are formed on the sidewalls of the bottom electrode 235. In one embodiment, the sidewall spacers formed on the sidewalls of the bottom electrode may be formed as part of the process for forming sidewall spacers on sidewalls of the dummy gates in the logic region (not shown) on the same substrate. The sidewall spacers, for example, include silicon nitride. Other types of spacer materials, such as silicon oxide or silicon oxynitride, may also be useful. To form the sidewall spacers, a spacer dielectric layer is deposited over the isolation layer. The spacer dielectric layer can be formed by using various techniques, such as PECVD. Other techniques to form the spacer dielectric layer are also useful. An anisotropic etch, such as RIE, may be performed to remove horizontal portions of the spacer layer, leaving spacers 228 on the sidewalls of the bottom electrode.

The process may continue by forming an ILD layer over the substrate, covering the dummy gates, raised S/D regions and isolation layer in the logic region (not shown). Excess dielectric material of the ILD layer is removed by planarization process, such as CMP to form a substantially coplanar top surface between the top surfaces of the dummy gates, sidewall spacers and ILD layer in the logic region. The exposed dummy gates over the logic region are removed.

Removal of the dummy gates leaves a gate trench or gate opening in the logic region on the substrate and exposes portions (e.g., channel regions) of the fin structures and inner sides of the spacers adjacent to the gate trench in the logic region. Materials and techniques for forming the ILD layer and removal of the dummy gates are similar to that described with respect to FIG. 3f and FIG. 3h.

Figure 4D:
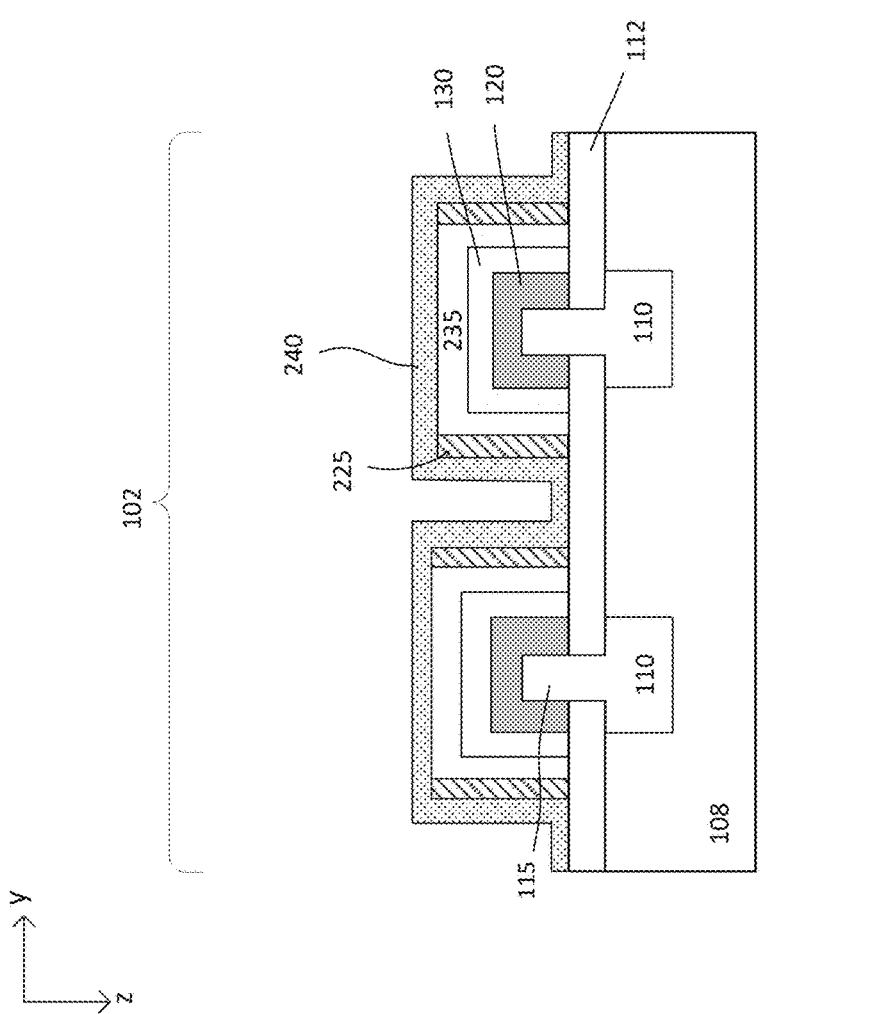

In one embodiment, the process continues to form replacement metal gates over the logic region by performing a replacement metal gate process. The replacement metal gate process also integrates the formation of 1S1R memory cell structures in the first region 102. For example, the replacement metal gate process which forms the high-k metal gates in the logic region also simultaneously forms the storage element over the selector element in the first region. To form the replacement metal gates, a high-k gate dielectric layer 240 is formed on the substrate. The high-k gate dielectric layer conformally lines the gate trenches and ILD layer in the logic region (not shown) and conformally lines the exposed isolation layer 112, spacers 228 and top surface of the bottom electrode 235 in the first region 102 as shown in FIG. 4d. The high-k gate dielectric layer, for example, may be $HfO_2$, HfSiON, $La_2O_3$, zirconium oxide or silicates thereof formed by ALD process. Other suitable types of high-k gate dielectric and forming techniques may also be useful. The high-k gate dielectric layer serves as a programmable resistive layer of a memory cell. In one embodiment, the high-k gate dielectric layer 240 is a continuous layer extending across columns and rows of an array and serves as a common resistive layer of memory cells of an array when viewed from top. Other configurations of the high-k gate dielectric layer may also be useful.

The replacement metal gate process continues to form a metal gate electrode layer 245, such as TaN or TiN, over the high-k gate dielectric layer in the logic and memory regions by ALD, CVD or PVD. The metal gate electrode layer corresponds to a second electrode layer in the first region 102. In one embodiment, the metal gate electrode layer 245 lines the ILD and fills the remaining of the gate trenches in the logic region (not shown) while filling the spaces between the vertical portions of the high-k gate dielectric layer 240 and covering the high-k gate dielectric in the memory region 102 as shown in FIG. 4e. The substrate is planarized to remove excess high-k gate dielectric and metal gate electrode materials. In one embodiment, the planarization process is CMP. Other types of planarization processes may also be useful. The CMP, for example, forms a substantially coplanar top surface between the ILD, high-k gate dielectric and metal gate electrode in the logic region (not shown) and forms a substantially planar top surface between the ILD and top electrode 245 in the first region 102 as shown in FIG. 4e. The metal gate electrode layer in the first (or memory) region is patterned using mask and etch techniques such that it extends along a column of memory cells in an array when viewed from top. The second electrode layer in the first region 102 serves as a top electrode 245 of a memory cell. As shown, the second electrode layer may also serve as a common top electrode of a column of memory cells of an array.

The process continues similar to that as described in FIG. 3j to complete the formation of the memory cells and logic devices. For example, additional processes include forming via contacts or contact plugs 285 to contact regions of the memory cells and logic transistors, BEOL process to finish the manufacturing of the device, such as forming of one or more conductive lines 190 and additional interconnect levels, final passivation, dicing, assembly, packaging and testing. Other processes are also useful.

The devices 100 and 200 and the processes 300 and 400 for forming the device according to the present disclosure offers a number of advantages. The memory device, as described, includes a resistive memory element stacked over a fin-type based selector. This allows for a highly compact (cell area of about $4F^2$) RRAM cell and a high density cross-bar memory array configuration to be achieved. Moreover, the fin-type based selector is coupled in series with the programmable resistive layer of the memory cell to form a 1S1R RRAM structure, which eliminates sneak path and avoid cross-talk interference in a cross-bar array configuration. Through the use of fin-type based selector as a select element, high forward current density may also be achieved. Furthermore, the processes 300 and 400 to embed the MTP RRAM cell with fin-type based selector are highly compatible and easily integrated with CMOS logic processing. As described, the processes allow the MTP RRAM cell with fin-type based selector to be formed together or simultaneously with the logic transistors on the same substrate. Some of these processes do not require additional mask for embedding the MTP RRAM cell with fin-type based selector with the logic devices. Thus, the processes as described are simplified and are cost effective. Moreover, the processes as described are very flexible as it allows for NPN or PNP type of selectors to be formed by changing the dopant types of the fin structure and the first and second semiconductor layers. In addition, band-gap engineering may be easily employed or adapted for the formation of the first and second semiconductor layers to improve on/off current ($I_{on}/I_{off}$) ratio for better device performance. For example, band-gap engineering may be employed to modulate the band-gap between PN or NP junctions or regions of the selector which enhances the $I_{on}/I_{off}$ ratio.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
    providing a substrate prepared with at least a first region for accommodating one or more multi-time programmable resistive random access memory (RRAM) cell;
    processing the substrate to form a fin structure in the first region;
    forming an isolation layer on a top surface of the substrate, wherein the isolation layer surrounds a bottom fin portion of the fin structure, wherein a top fin portion of the fin structure is exposed above the isolation layer;
    doping the fin structure with first polarity type dopants;
    forming a first semiconductor layer over the top fin portion of the fin structure, wherein the first semiconductor layer wraps around a top surface and sides of the top fin portion, wherein the first semiconductor layer comprises second polarity type dopants opposite to the first polarity type;
    forming a second semiconductor layer over the first semiconductor layer in the first region, wherein the second semiconductor layer wraps around a top surface and sides of the first semiconductor layer, and the second semiconductor layer comprises the first polarity type dopants, wherein the combination of the doped fin structure, the first semiconductor layer and the second semiconductor layer forms a fin-type selector in the first region; and forming a storage element of the RRAM cell over the fin-type selector, wherein the fin-type selector is coupled in series with the storage element of the RRAM cell.

2. The method of claim 1 wherein forming the storage element comprises:

forming a programmable resistive layer over the second semiconductor layer; and forming a top electrode over the programmable resistive layer, wherein the programmable resistive layer wraps around a bottom surface and sides of the top electrode.

3. The method of claim 2 wherein:

the programmable resistive layer comprises a programmable resistive material having a high-k dielectric layer that creates conduction paths or filaments when subjected to a forming procedure; and the top electrode comprises a metal material.

4. The method of claim 1 wherein the first semiconductor layer is formed on the entire top fin portion of the fin structure in the first region, and wherein the second semiconductor layer completely covers the top surface and sides of the first semiconductor layer in the first region.

5. The method of claim 2 wherein forming the storage element further comprises forming a bottom electrode in between the programmable resistive layer and the second semiconductor layer, and wherein the bottom electrode layer wraps around sides and a top surface of the second semiconductor layer.

6. The method of claim 5 wherein the programmable resistive layer is formed over sides and a top surface of the bottom electrode.

7. The method of claim 1 wherein the first and second semiconductor layers include epitaxially grown layers.

8. The method of claim 4 wherein a programmable resistive layer lines sidewalls and a bottom of a top electrode.

9. A method for forming a device comprising:

providing a substrate prepared with at least a first region for accommodating one or more multi-time programmable resistive random access memory (RRAM) cell and a second region for accommodating one or more logic transistor;

processing the substrate to form a fin structure in each of the first and second regions;

forming an isolation layer on a top surface of the substrate in the first and second regions, wherein the isolation layer surrounds a bottom fin portion of each fin structure, wherein a top fin portion of each fin structure is exposed above the isolation layer;

doping the fin structures in the first and second regions with first polarity type dopants;

forming a first semiconductor layer over the top fin portion of each fin structure in the first and second regions, wherein the first semiconductor layer comprises second polarity type dopants opposite to the first polarity type, and the first semiconductor layer in the second region forms elevated source/drain regions of a fin-type logic transistor in the second region;

forming a second semiconductor layer over the first semiconductor layer in the first region, wherein the second semiconductor layer comprises the first polarity type dopants, wherein the combination of the doped fin structure, the first semiconductor layer and the second semiconductor layer forms a fin-type selector in the first region; and forming a storage element of the RRAM cell over the fin-type selector in the first region, wherein the fin-type selector is coupled in series with the storage element of the RRAM cell.

10. The method of claim 9 comprising:

forming a dummy gate over the fin structure in the second region prior to forming the first semiconductor layer, wherein the dummy gate wraps around and traverses a channel region disposed along the top fin portion of the fin structure in the second region, wherein forming the first semiconductor layer in the second region forms the elevated source/drain regions on the top fin portion and adjacent to first and second sides of the dummy gate.

11. The method of claim 10 comprising:

forming a dielectric layer over the first and second regions, wherein the dielectric layer covers the dummy gate in the second region;

planarizing the dielectric layer to form a substantially coplanar surface between the dummy gate and the dielectric layer;

removing the dummy gate in the second region to form a gate opening which exposes a portion of the fin structure in the second region; and forming a trench in the first region by removing a portion of the dielectric layer to expose a top surface portion of the second semiconductor layer.

12. The method of claim 11 wherein forming the storage element comprises:

performing a replacement metal gate process, wherein the replacement metal gate process comprises forming a programmable resistive layer over the substrate, wherein the programmable resistive layer lines sidewalls and a bottom of the gate opening in the second region and lines sidewalls and a bottom of the trench in the first region, and forming a metal gate electrode layer over the programmable resistive layer in the first and second regions, wherein the metal gate electrode layer fills the gate opening and the trench.

13. The method of claim 10 comprising:

forming a bottom electrode layer over the second semiconductor layer in the first region, wherein the bottom electrode layer wraps around sides and a top surface of the second semiconductor layer; and forming sidewall spacers adjacent to sidewalls of the bottom electrode layer.

14. The method of claim 13 comprising:

forming a dielectric layer over the first and second regions, wherein the dielectric layer covers the dummy gate in the second region;

planarizing the dielectric layer to form a substantially coplanar surface between the dummy gate and the dielectric layer; and removing the dummy gate in the second region to form a gate opening which exposes a portion of the fin structure in the second region.

15. The method of claim 14 wherein forming the storage element comprises:

performing a replacement metal gate process, wherein the replacement metal gate process comprises forming a programmable resistive layer over the substrate, wherein the programmable resistive layer lines sidewalls and a bottom of the gate opening in the second region, and lines sidewalls of the spacers and a top surface of the bottom electrode in the first region, and forming a metal gate electrode layer over the programmable resistive layer in the first and second regions, wherein the metal gate electrode layer fills the gate opening in the second region.

16. The method of claim 9 wherein the first and second semiconductor layers include epitaxially grown layers.

17. The method of claim 10 wherein the channel region of the fin structure in the second region is between the elevated source/drain regions and below the dummy gate.

18. A method for forming a device comprising:
providing a substrate prepared with a memory region and a non-memory region;
processing the substrate to form a fin structure in each of the memory and non-memory regions;
doping the fin structures in the memory and non-memory regions with first polarity type dopants;
forming a first semiconductor layer on a top fin portion of each of the fin structures in the memory and non-memory regions, wherein the first semiconductor layer wraps around the entire top fin portion of the fin structure in the memory region, wherein the first semiconductor layer comprises second polarity type dopants opposite to the first polarity type;

forming a second semiconductor layer over the first semiconductor layer in the memory region, wherein
the second semiconductor layer completely covers a top surface and sides of the first semiconductor layer in the memory region,
the second semiconductor layer comprises the first polarity type dopants, and
the combination of the doped fin structure, the first semiconductor layer and the second semiconductor layer forms a fin-type selector over the substrate in the memory region; and forming a storage element of a resistive random access memory (RRAM) cell over the fin-type selector, wherein the fin-type selector is coupled in series with the storage element of the RRAM cell.

19. The method of claim 18 wherein forming the first semiconductor layer in the non-memory region forms elevated source/drain regions of a fin-type transistor in the non-memory region.

* * * * *